(12) United States Patent
Hoffman

(10) Patent No.: US 7,521,370 B2
(45) Date of Patent: Apr. 21, 2009

(54) METHOD OF OPERATING A PLASMA REACTOR CHAMBER WITH RESPECT TO TWO PLASMA PARAMETERS SELECTED FROM A GROUP COMPRISING ION DENSITY, WAFER VOLTAGE, ETCH RATE AND WAFER CURRENT, BY CONTROLLING CHAMBER PARAMETERS OF SOURCE POWER AND BIAS POWER

(75) Inventor: Daniel J. Hoffman, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 108 days.

(21) Appl. No.: 11/508,540

(22) Filed: Aug. 23, 2006

(65) Prior Publication Data

US 2006/0283835 A1    Dec. 21, 2006

Related U.S. Application Data

(63) Continuation of application No. 10/440,364, filed on May 16, 2003, now Pat. No. 7,247,218.

(51) Int. Cl.
*H01L 21/302* (2006.01)

(52) U.S. Cl. .............................. 438/714; 216/59; 216/61

(58) Field of Classification Search ................. 438/706, 438/710, 712, 714; 216/59, 61, 67; 156/345.24, 156/345.25, 345.28, 345, 43
See application file for complete search history.

(56) References Cited

U.S. PATENT DOCUMENTS

| | | | |
|---|---|---|---|
| 2,951,960 A | 9/1960 | Watrous, Jr. ................. 313/36 |
| 2,967,926 A | 1/1961 | Edstrom ....................... 219/75 |
| 3,355,615 A | 11/1967 | Le Bihan et al. ............... 313/63 |
| 3,610,986 A | 10/1971 | King ............................. 313/63 |
| 4,458,180 A | 7/1984 | Sohval ................... 315/111.81 |
| 4,464,223 A | 8/1984 | Gorin .......................... 156/643 |
| 4,570,106 A | 2/1986 | Sohval et al. .......... 315/111.81 |
| 4,579,618 A | 4/1986 | Celestino et al. ............ 156/345 |
| 4,859,908 A | 8/1989 | Yoshida et al. ......... 315/111.81 |
| 4,888,518 A | 12/1989 | Grunwald ...................... 313/40 |
| 4,973,883 A | 11/1990 | Hirose et al. ........... 315/111.41 |

(Continued)

FOREIGN PATENT DOCUMENTS

| | | |
|---|---|---|
| EP | 0 343 500 A1 | 11/1989 |
| EP | 0 678 903 | 10/1995 |
| EP | 0 719 447 | 7/1998 |
| WO | WO 01/71765 | 9/2001 |

OTHER PUBLICATIONS

King, Ronald W.P., "Transmission-Line Theory", Dover Publications, Inc., 1965, New York, pp. 1-10 and 282-286.

*Primary Examiner*—Kin-Chan Chen
(74) *Attorney, Agent, or Firm*—Law Office of Robert M. Wallace

(57) ABSTRACT

A plasma reactor chamber is characterized by performing the following steps: (a) for each one of the chamber parameters, ramping the level of the one chamber parameter while sampling RF electrical parameters at an RF bias power input to the wafer support pedestal and computing from each sample of the RF electrical parameters the values of the plasma parameters, and storing the values with the corresponding levels of the one chamber parameter as corresponding chamber parameter data; (b) for each one of the chamber parameters, deducing, from the corresponding chamber parameter data, a single variable function for each of the plasma parameters having the one chamber parameter as an independent variable.

18 Claims, 17 Drawing Sheets

U.S. PATENT DOCUMENTS

| | | | |
|---|---|---|---|
| 4,990,229 A | 2/1991 | Campbell et al. | 204/298.06 |
| 5,006,760 A | 4/1991 | Drake, Jr. | 315/111.21 |
| 5,017,835 A | 5/1991 | Oechsner | 315/111.81 |
| 5,032,202 A | 7/1991 | Tsai et al. | 156/345 |
| 5,053,678 A | 10/1991 | Koike et al. | 315/111.81 |
| 5,055,853 A | 10/1991 | Garnier | 343/769 |
| 5,074,456 A | 12/1991 | Degner et al. | 228/121 |
| 5,077,499 A | 12/1991 | Oku | 315/111.21 |
| 5,089,083 A | 2/1992 | Kojima et al. | 156/643 |
| 5,107,170 A | 4/1992 | Ishikawa et al. | 313/362.1 |
| 5,115,167 A | 5/1992 | Ootera et al. | 315/111.21 |
| 5,122,251 A | 6/1992 | Campbell et al. | 204/298.06 |
| 5,134,603 A * | 7/1992 | Baas | 720/606 |
| 5,140,223 A | 8/1992 | Gesche et al. | 315/111.21 |
| 5,175,472 A | 12/1992 | Johnson et al. | 315/111.21 |
| 5,195,045 A | 3/1993 | Keane et al. | 364/482 |
| 5,198,725 A | 3/1993 | Chen et al. | 315/111.41 |
| 5,210,466 A | 5/1993 | Collins et al. | 315/111.21 |
| 5,213,658 A | 5/1993 | Ishida | 156/643 |
| 5,218,271 A | 6/1993 | Egorov et al. | 315/111.61 |
| 5,223,457 A | 6/1993 | Mintz et al. | 437/225 |
| 5,225,024 A | 7/1993 | Hanley et al. | 156/345 |
| 5,246,532 A | 9/1993 | Ishida | 156/345 |
| 5,256,931 A | 10/1993 | Bernadet | 313/360.1 |
| 5,272,417 A | 12/1993 | Ohmi | 315/111.21 |
| 5,273,610 A | 12/1993 | Thomas, III et al. | 156/62.7 |
| 5,274,306 A | 12/1993 | Kaufman et al. | 315/111.41 |
| 5,279,669 A | 1/1994 | Lee | 118/723 |
| 5,280,219 A | 1/1994 | Ghanbari | 315/111.41 |
| 5,300,460 A | 4/1994 | Collins et al. | 437/225 |
| 5,325,019 A | 6/1994 | Miller et al. | 315/111.21 |
| 5,401,351 A | 3/1995 | Samukawa | 156/345 |
| 5,432,315 A | 7/1995 | Kaji et al. | 219/121.43 |
| 5,453,305 A | 9/1995 | Lee | 427/562 |
| 5,463,525 A | 10/1995 | Barnes et al. | 361/234 |
| 5,467,013 A * | 11/1995 | Williams et al. | 324/127 |
| 5,474,648 A | 12/1995 | Patrick et al. | 156/627.1 |
| 5,512,130 A | 4/1996 | Barna et al. | 156/651.1 |
| 5,534,070 A | 7/1996 | Okamura et al. | 118/723 |
| 5,537,004 A | 7/1996 | Imahashi et al. | 315/111.21 |
| 5,554,223 A | 9/1996 | Imahashi | 118/723 |
| 5,556,549 A | 9/1996 | Patrick et al. | 216/61 |
| 5,567,268 A | 10/1996 | Kadomura | 156/345 |
| 5,576,600 A | 11/1996 | McCrary et al. | 315/111.81 |
| 5,576,629 A | 11/1996 | Turner et al. | 324/709 |
| 5,587,038 A | 12/1996 | Cecchi et al. | 156/345 |
| 5,592,055 A | 1/1997 | Capacci et al. | 315/111.21 |
| 5,595,627 A | 1/1997 | Inazawa et al. | 156/643.1 |
| 5,605,637 A | 2/1997 | Shan et al. | 216/71 |
| 5,618,382 A | 4/1997 | Mintz et al. | 216/64 |
| 5,627,435 A | 5/1997 | Jansen et al. | 315/111.21 |
| 5,654,679 A * | 8/1997 | Mavretic et al. | 333/17.3 |
| 5,660,671 A | 8/1997 | Harada et al. | 156/345 |
| 5,661,669 A | 8/1997 | Mozumder et al. | 702/84 |
| 5,662,770 A | 9/1997 | Donohoe | 438/716 |
| 5,674,321 A | 10/1997 | Pu et al. | 118/723 |
| 5,685,914 A | 11/1997 | Hills et al. | 118/723 |
| 5,705,019 A | 1/1998 | Yamada et al. | 156/345 |
| 5,707,486 A | 1/1998 | Collins | 156/643.1 |
| 5,710,486 A | 1/1998 | Ye et al. | 315/111.21 |
| 5,720,826 A | 2/1998 | Hayashi et al. | 136/249 |
| 5,733,511 A | 3/1998 | De Francesco | 422/186.05 |
| 5,770,922 A | 6/1998 | Gerrish et al. | 315/111.21 |
| 5,792,376 A | 8/1998 | Kanai et al. | 216/71 |
| 5,846,885 A | 12/1998 | Kamata et al. | 438/729 |
| 5,849,136 A | 12/1998 | Mintz et al. | 156/345 |
| 5,849,372 A | 12/1998 | Annaratone et al. | 427/569 |
| 5,855,685 A | 1/1999 | Tobe et al. | 118/723 |
| 5,858,819 A | 1/1999 | Miyasaka | 438/149 |
| 5,863,376 A | 1/1999 | Wicker et al. | 156/345 |
| 5,866,986 A | 2/1999 | Pennington | 315/111.21 |
| 5,868,848 A | 2/1999 | Tsukamoto | 118/723 |
| 5,885,358 A | 3/1999 | Maydan et al. | 118/723 |
| 5,889,252 A | 3/1999 | Williams et al. | 219/121.54 |
| 5,904,799 A | 5/1999 | Donohoe | 156/345 |
| 5,914,568 A | 6/1999 | Nonaka | 315/111.21 |
| 5,929,717 A | 7/1999 | Richardson et al. | 333/17.3 |
| 5,936,481 A | 8/1999 | Fuji | 333/17.3 |
| 5,939,886 A | 8/1999 | Turner et al. | 324/464 |
| 5,942,074 A | 8/1999 | Lenz et al. | 156/345 |
| 5,971,591 A | 10/1999 | Vona et al. | 364/478.08 |
| 5,997,962 A | 12/1999 | Ogasawara et al. | 427/535 |
| 6,016,131 A | 1/2000 | Sato et al. | 343/895 |
| 6,043,608 A | 3/2000 | Samukawa et al. | 315/111.51 |
| 6,073,577 A | 6/2000 | Lilleland et al. | 118/723 |
| 6,089,182 A | 7/2000 | Hama | 118/723 |
| 6,093,457 A | 7/2000 | Okumura et al. | 427/569 |
| 6,095,084 A | 8/2000 | Shamouilian et al. | 118/723 E |
| 6,096,160 A | 8/2000 | Kadomura | 156/345 |
| 6,106,663 A | 8/2000 | Kuthi et al. | 156/345 |
| 6,110,395 A | 8/2000 | Gibson, Jr. | 216/67 |
| 6,113,731 A | 9/2000 | Shan et al. | 156/345 |
| 6,142,096 A | 11/2000 | Sakai et al. | 118/723 |
| 6,152,071 A | 11/2000 | Akiyama et al. | 118/723 |
| 6,155,200 A | 12/2000 | Horijke et al. | 118/723 |
| 6,162,709 A | 12/2000 | Raoux et al. | 438/513 |
| 6,174,450 B1 | 1/2001 | Patrick et al. | 216/61 |
| 6,188,564 B1 | 2/2001 | Hao | 361/234 |
| 6,213,050 B1 | 4/2001 | Liu et al. | 118/723 |
| 6,218,312 B1 | 4/2001 | Collins et al. | 438/723 |
| 6,245,190 B1 | 6/2001 | Masuda et al. | 156/345 |
| 6,251,216 B1 | 6/2001 | Okamura et al. | 156/345 |
| 6,262,538 B1 | 7/2001 | Keller | 315/111.21 |
| 6,290,806 B1 | 9/2001 | Donohoe | 156/345 |
| 6,291,999 B1 | 9/2001 | Nishimori et al. | 324/464 |
| 6,337,292 B1 | 1/2002 | Kim et al. | 438/787 |
| 6,346,915 B1 | 2/2002 | Okumura et al. | 343/701 |
| RE37,580 E | 3/2002 | Barnes et al. | 361/234 |
| 6,424,232 B1 * | 7/2002 | Mavretic et al. | 333/17.3 |
| 6,449,568 B1 | 9/2002 | Gerrish | 702/60 |
| 6,451,703 B1 | 9/2002 | Liu et al. | 438/710 |
| 6,462,481 B1 | 10/2002 | Holland et al. | 315/111.21 |
| 6,528,751 B1 | 3/2003 | Hoffman et al. | 219/121.43 |
| 6,586,886 B1 | 7/2003 | Katz et al. | 315/111.21 |
| 6,652,712 B2 | 11/2003 | Wang et al. | 156/345.48 |
| 6,804,572 B1 * | 10/2004 | Cooperberg et al. | 700/121 |
| 6,818,097 B2 | 11/2004 | Yamaguchi et al. | 156/345.47 |
| 7,138,767 B2 * | 11/2006 | Chen et al. | 315/111.21 |
| 7,247,218 B2 | 7/2007 | Hoffman | 156/345.28 |
| 2002/0026251 A1 * | 2/2002 | Johnson et al. | 700/67 |
| 2002/0108933 A1 | 8/2002 | Hoffman et al. | 219/121.43 |
| 2002/0142493 A1 | 10/2002 | Halliyal et al. | 438/14 |
| 2003/0003757 A1 | 1/2003 | Nallan et al. | 438/710 |
| 2003/0168427 A1 | 9/2003 | Flamm et al. | 216/2 |
| 2004/0235304 A1 * | 11/2004 | Oh | 438/689 |
| 2005/0151544 A1 | 7/2005 | Mahoney et al. | 324/655 |
| 2006/0144518 A1 * | 7/2006 | Kaji et al. | 156/345.43 |
| 2006/0226786 A1 | 10/2006 | Lin et al. | 315/111.21 |
| 2006/0278608 A1 | 12/2006 | Hoffman | 216/61 |
| 2006/0278609 A1 | 12/2006 | Hoffman | 216/61 |
| 2006/0278610 A1 | 12/2006 | Hoffman | 216/61 |
| 2007/0029282 A1 | 2/2007 | Hoffman | 216/59 |
| 2007/0080137 A1 | 4/2007 | Hoffman et al. | 216/59 |
| 2007/0080138 A1 | 4/2007 | Hoffman et al. | 216/59 |
| 2007/0080139 A1 | 4/2007 | Hoffman et al. | 216/59 |
| 2007/0080140 A1 | 4/2007 | Hoffman et al. | 216/59 |
| 2007/0095788 A1 | 5/2007 | Hoffman et al. | 216/59 |

* cited by examiner

METHOD OF OPERATING A PLASMA REACTOR CHAMBER WITH RESPECT TO TWO PLASMA PARAMETERS SELECTED FROM A GROUP COMPRISING ION DENSITY, WAFER VOLTAGE, ETCH RATE AND WAFER CURRENT, BY CONTROLLING CHAMBER PARAMETERS OF SOURCE POWER AND BIAS POWER

CROSS-REFERENCE TO RELATED APPLICATIONS

This application is a continuation of U.S. application Ser. No. 10/440,364, filed May 16, 2003 by Daniel Hoffman, entitled PLASMA DENSITY, ENERGY AND ETCH RATE MEASUREMENTS AT BIAS POWER INPUT AND REAL TIME FEEDBACK CONTROL OF PLASMA SOURCE AND BIAS POWER, issued as U.S. Pat. No. 7,247,218 on Jul. 24, 2007, and assigned to the present assignee.

BACKGROUND OF THE INVENTION

Plasma reactors employed in microelectronic circuit fabrication can etch or deposit thin film layers on a semiconductor substrate. In a plasma reactive ion etch process, the etch rate, ion density, wafer voltage and wafer current are critical in controlling etch selectivity, wafer heating, etch striations, ion bombardment damage, etch stopping, feature size and other effects. Such control becomes more critical as feature size decreases and device density increases. The main problem is that present techniques for measuring etch rate, ion density, wafer voltage and wafer current tend to be highly inaccurate (in the case of the wafer voltage) or must be performed by examining a test workpiece or wafer at the conclusion of processing (in the case of etch rate). There appears to be no accurate technique for measuring these parameters in "real time" (i.e., during wafer processing). As a result, the plasma reactor control parameters (source power, bias power, chamber pressure, gas flow rate and the like) must be selected before processing a current workpiece based upon prior results obtained by processing other workpieces in the chamber. Once target values for each of the reactor control parameters have been chosen to achieve a desired etch rate or a desired wafer voltage or a desired ion density, the target values must remain the same throughout the process step, and all efforts are dedicated to maintaining the chosen target values. If for example the chosen target value of one of the control parameters unexpectedly leads to a deviation from the desired processing parameter (e.g., etch rate), this error will not be discovered until after the current workpiece has been processed and then examined, and therefore the current workpiece or wafer cannot be saved from this error. As a result, the industry is typically plagued with significant losses in materiel and time.

A related problem is that plasma process evolution and design is slow and inefficient in that the discovery of optimal target values for the reactor control parameters of source power, bias power, chamber pressure and the like typically relies upon protracted trial and error methods. The selection of target values for the many reactor control parameters (e.g., source power, bias power, chamber pressure and the like) to achieve a particular etch rate at a particular wafer current (to control wafer heating) and at a particular wafer voltage (to control ion bombardment damage) and at a particular ion density (to control etch selectivity, for example) is a multi-dimensional problem. The mutual dependence or lack thereof among the various reactor control parameters (source power, bias power, chamber pressure, etc.) in reaching the desired target values of the process parameters (e.g., etch rate, wafer voltage, wafer current, ion density) is generally unknown, and the trial and error process to find the best target values for the reactor control parameters (bias and source power levels and chamber pressure) is necessarily complex and time consuming. Therefore, it is not possible to optimize or alter target values for the process parameters (e.g., etch rate, etc.) without a time-consuming trial and error process. Thus, real-time plasma process control or management has not seemed possible.

SUMMARY OF THE INVENTION

A workpiece is processed in a plasma reactor chamber in accordance with desired values of two plasma parameters selected from a group comprising ion density, wafer voltage, etch rate and wafer current, by controlling chamber parameters of source power and bias power. First, the chamber is characterized by performing the following steps: (a) for each one of the chamber parameters, ramping the level of the one chamber parameter while sampling RF electrical parameters at an RF bias power input to the wafer support pedestal and computing from each sample of the RF electrical parameters the values of the plasma parameters, and storing the values with the corresponding levels of the one chamber parameter as corresponding chamber parameter data; (b) for each one of the chamber parameters, deducing, from the corresponding chamber parameter data, a single variable function for each of the plasma parameters having the one chamber parameter as an independent variable; (c) constructing combinations of the functions and from the combinations, constructing surfaces defining concurrent values of the chamber parameters, each respective surface corresponding to a respective constant value of one of the plasma parameters, and storing the surfaces.

Processing of a production workpiece is carried out by controlling a plasma in the chamber in accordance with user-selected values of each of the plasma parameters, by performing the following steps: (a) for each one of the plasma parameters, fetching a relevant surface of constant value corresponding to the user-selected value of the one plasma parameter, and determining an intersection of the relevant surfaces which defines a target value of source power and bias power; (b) setting the source power and bias power in the chamber, respectively, to the target value.

DETAILED DESCRIPTION OF THE INVENTION

Introduction

Figure 1:
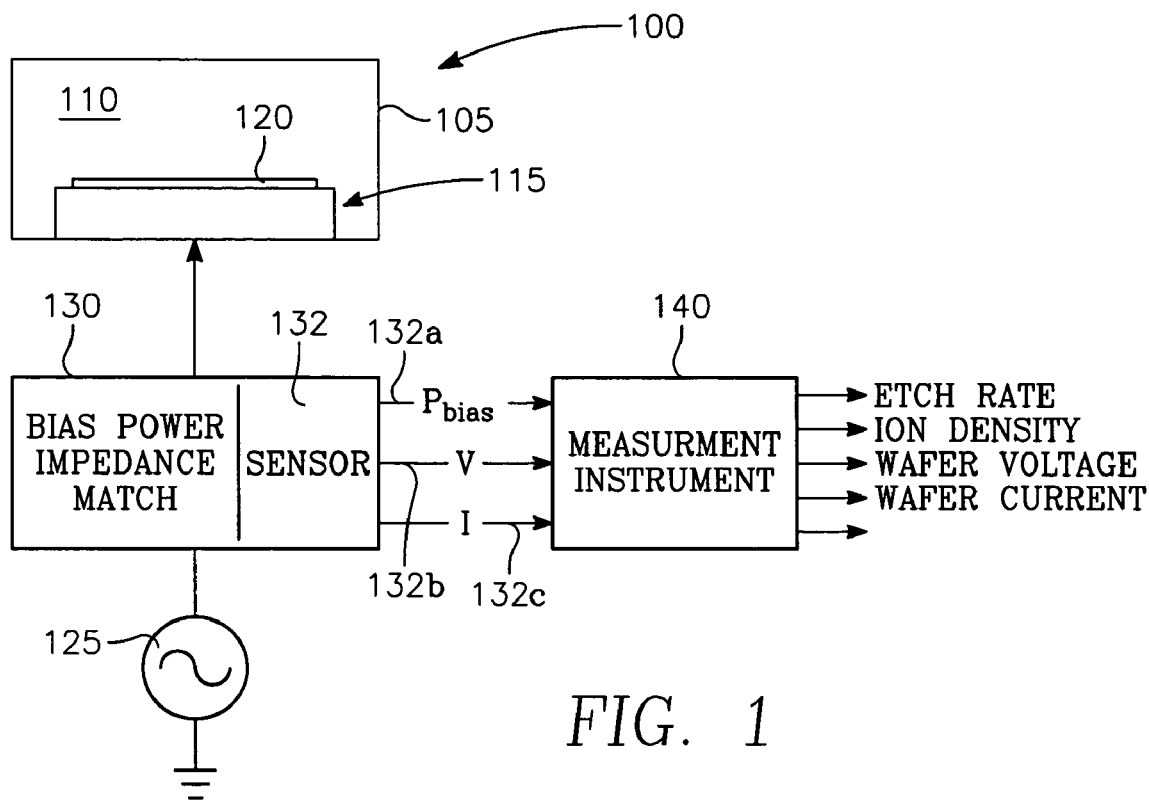
FIG. 1 illustrates a plasma reactor and a measurement instrument therefor.

The present description pertains to a plasma reactor having a plasma source power applicator (such as an overhead electrode or antenna) in which plasma bias power is applied to the wafer through the wafer support pedestal. I have discovered a measurement instrument (described below) that is the first one known to instantaneously and accurately measure wafer voltage, wafer current, ion density and etch rate. The measurement instrument uses only conventional electrical sensors at the bias power input that sense voltage, current and power at the output of an impedance match device coupled to the wafer support pedestal. The measurement instrument is therefore non-invasive of the plasma etch process occurring within the reactor chamber in addition to being accurate. The degree of accuracy is surprising, surpassing even the best known instruments and measurement techniques currently in use.

I have invented a plasma reactor having a feedback controller employing this same measurement instrument, in which plasma source power and plasma bias power are controlled in separate feedback control loops. In the bias power feedback control loop, plasma bias power is servoed or controlled to minimize the difference between a user-selected target value of the ion energy (or, equivalently, wafer voltage) and the actual ion energy sensed in real time by my measurement instrument. Simultaneously, in the source power feedback control loop, plasma source power is servoed or controlled to minimize the difference between a user-selected target value of the plasma ion density and the actual plasma ion density sensed in real time by my measurement instrument and a user-selected target value for the ion density. One surprising feature of my feedback controller is that a measurement at the bias power input is used to control the source power.

In addition, I have solved the problem of how to select the target values for ion density and ion energy. Because my measurement instrument provides instantaneous, accurate and simultaneous measurements of performance parameters such as wafer voltage (or, equivalently, ion energy), wafer current, ion density and etch rate, it has enabled me to observe accurately, for the first time, the real-time behavior of all these performance parameters simultaneously as a function of control parameters such as plasma source power, plasma bias power and others (e.g., chamber pressure, source power frequency, applied magnetic field, etc.). These observations have led to my discovery herein that the control parameters of plasma source power level and plasma bias power level affect the set of performance parameters (e.g., etch rate, ion energy, ion density) in the manner of a pair of independent variables. This discovery greatly simplifies the task of controlling plasma processing: by holding various other control parameters constant during processing (i.e., constant chamber pressure, constant gas flow rates, constant source power frequency and bias power frequency, etc.), the process is controlled entirely through the bias and source power levels. I have used this technique to parameterize all of the performance parameters (including etch rate, ion energy and others) as unique functions of two independent variables, namely source power level and bias power level. From this, I have generated curves in 2-dimensional source power-bias power space of constant etch rate, constant ion energy and constant ion density, for example. A process controller responds to user-selected ranges for the various performance parameters (etch rate, ion energy, ion density) using the curves of constant etch rate, constant ion density and constant ion energy to instantaneously find a target value for the source power level and the bias power level. This process controller provides the target values for the plasma source power level and plasma bias power level to the feedback controller referred to above.

As a result, a user need not have any knowledge of the control parameters (e.g., bias and source power levels) that may be required to realize a desired set of performance parameter values (e.g., etch rate) nor a corresponding understanding of the reactor's behavior in this regard. Instead, the user merely inputs to the control processor his set of desired performance parameter values or ranges, and the control processor instantly specifies target control parameter values (target source power and bias power values) to the feedback controller referred to above. Thereafter, control of the plasma process is entirely automatic, and can instantly accommodate any changes the user may introduce. For example, the user may specify different etch rates at different times during the same etch step, so that one etch rate prevails during the beginning of an etch process and another prevails toward the end of the process, for example. The user need not specify any control parameters, but only the results he desires (i.e., the performance parameters such as etch rate, etc.).

Instrument for Instantaneously Measuring Performance Parameters Including Etch Rate, Ion Density and Ion Energy:

Referring to FIG. 1, a plasma reactor 100 has a chamber enclosure 105 enclosing a vacuum chamber 110 in which a wafer support pedestal 115 supports a semiconductor wafer 120 being processed. Plasma RF bias power from an RF bias power generator 125 is applied through an impedance match circuit 130 to the wafer support pedestal 115. Conventional sensing circuits 132 within the impedance match circuit 130 have three output terminals 132a, 132b, 132c providing respective signals indicating the power ($P_{bias}$), voltage (V) and current (I) furnished at the output of the impedance match circuit 130 to the wafer support pedestal 115. A measurement instrument 140, which is the measurement instrument referred to above in this specification, uses the signals from the output terminals 132a, 132b, 132c to measure, simultaneously, etch rate on the wafer 120, ion energy at the wafer surface (or equivalently, wafer voltage), ion density in the reactor chamber and electric current through the wafer 120. The measurement instrument 140 employs processes based upon an electrical model of the reactor 100. This model is illustrated in FIG. 2.

Figure 2:
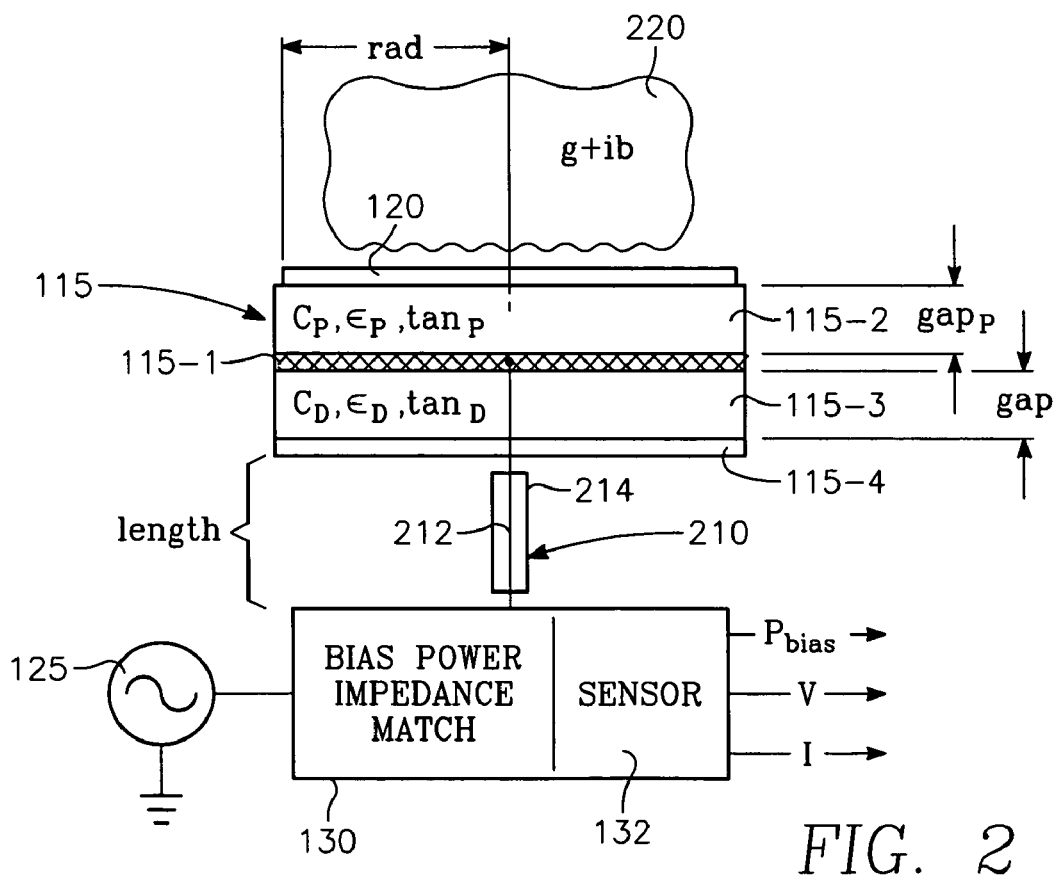
FIG. 2 illustrates an electrical model of the plasma reactor employed by the measurement instrument.

FIG. 2 depicts the plasma reactor of FIG. 1 in greater detail, so that the individual elements of the wafer support pedestal 115 are visible, including an electrode 115-1, a thin overlying dielectric (e.g., ceramic) layer 115-2, an underlying dielectric (e.g., ceramic) layer 115-3, and a conductive (e.g., aluminum) planar ground plate 115-4 at the bottom of the pedestal 115. The electrode 115-1 takes the form of a conductive grid in the illustrated embodiment, and may be implemented in various forms such as a conductive solid plate or as a conductive mesh, for example. While the electrode 115-1 will hereinafter be referred to as a conductive grid, the term "grid" as employed in this specification refers to all forms that the electrode 115-1 may take, such as a conductive solid plate, or a conductive mesh, or a conductive screen, or a form combining aspects of any or all of the foregoing forms, for example. Also visible in FIG. 2 is a coaxial cable 210 connecting the output of the impedance match circuit 130 to the grid 115-1. The coaxial cable 210 has an inner conductor 212 and an outer conductor 214. An electrical model with parameters depicted in FIG. 2 characterizes the electrical properties of the plasma reactor 100, which are readily determined using conventional techniques. Specifically, the coaxial transmission line or cable 210 is characterized by three quantities: (1) its length, (2) $Z_{ch}$, its characteristic impedance, and (3) $V_{ch}$, its complex phase velocity in the transmission line equation. The wafer support pedestal 115 is characterized by electrical properties of the overlying and underlying dielectric layers 115-2 and 115-3. Specifically, the underlying dielectric layer 115-3 has a capacitance $C_D$, which is a function of (1) the dielectric constant, $\in_D$, of the dielectric layer 115-3, and (2) the conductive loss component of the dielectric layer 115-3, $\tan_D$, (3) the thickness, gap, of the dielectric layer 115-3 and (4) the radius of the wafer 120. The overlying dielectric layer 115-2 has a capacitance $C_P$ which is a function of (1) the thickness, $gap_P$, of the dielectric layer 115-2, (2) the dielectric constant, $\in_P$, of the dielectric layer 115-2 and (3) the conductive loss component of the dielectric layer 115-2, $\tan_P$. The plasma 220 is characterized by an admittance $Y_{plasma}$ (to RF ground such as the interior chamber walls or ceiling) that consists of a real part (the conductance g) and an imaginary part (the susceptance b). Each of these electrical parameters has a role in the operation of the measurement instrument 140.

Figure 3:
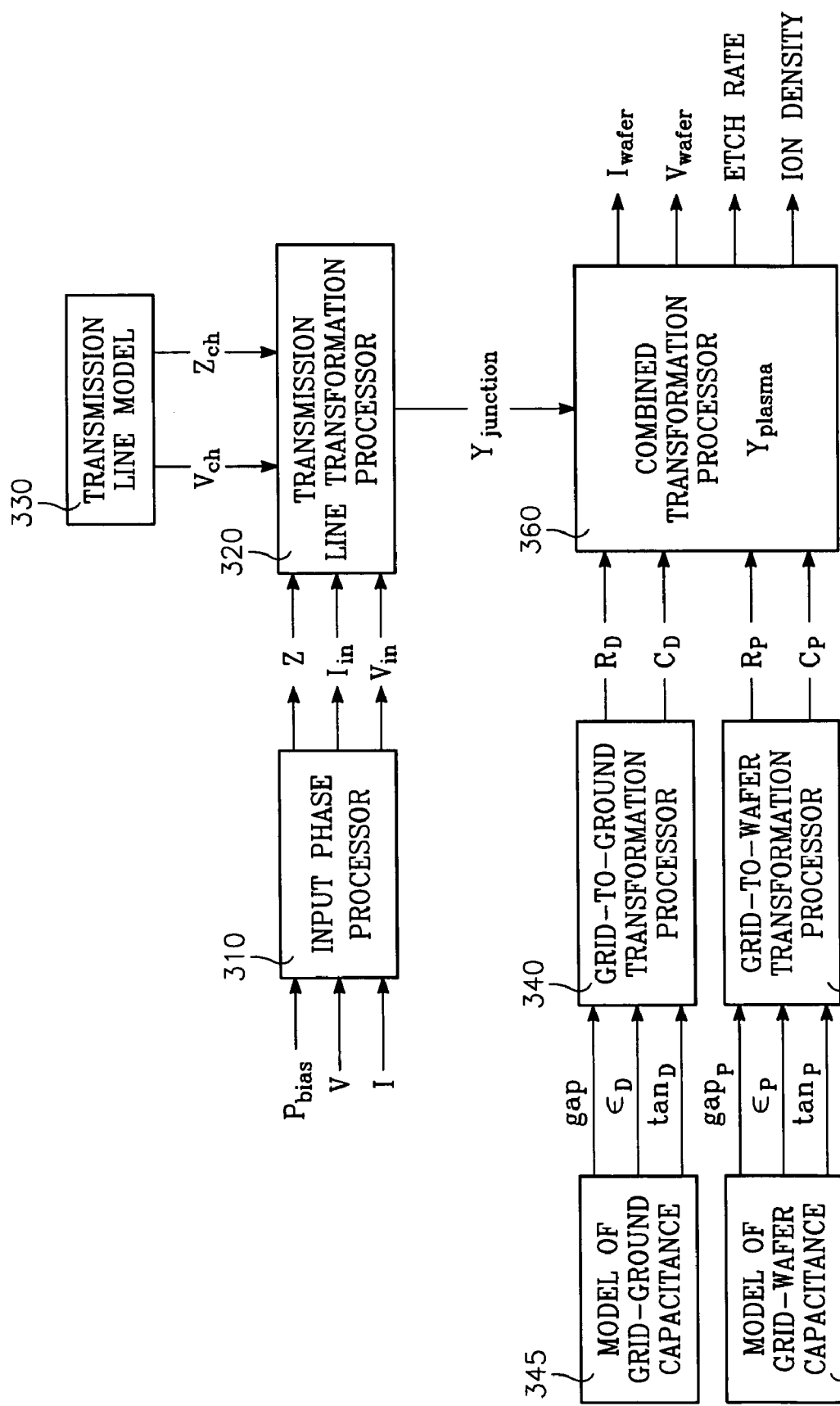
FIG. 3 illustrates the structure of the measurement instrument of FIG. 1.

FIG. 3 illustrates the structure of the measurement instrument 140 of FIG. 1. An input phase processor 310 receives the $P_{bias}$, V and I signals from the impedance match sensing circuit 132 of FIG. 1 and produces respective signals indicating a complex impedance Z, a complex input current $I_{in}$ and a complex input voltage $V_{in}$ at the near end of the coaxial cable 210 (i.e., the end nearest the impedance match circuit 130). A transmission line transformation processor 320 uses the characteristic impedance $Z_{ch}$ and the complex loss coefficient $V_{ch}$ (in the transmission line equation) from an electrical model 330 of the coaxial cable 210 to transform from Z, $I_{in}$ and $V_{in}$ at the near cable end to an admittance $Y_{junction}$ at the far cable end, i.e., at the junction between the coaxial cable 210 and the grid 115-1. A grid-to-ground transformation processor 340 takes radius, gap, $\in_D$ and $\tan_D$ from a model 345 of the grid-to-ground capacitance and produces a dielectric resistance $R_D$ and dielectric capacitance $C_D$. A grid-to-wafer transformation processor 350 takes radius, $gap_P$, $\in_P$ and $\tan_P$ from a model 355 of the grid-to-wafer capacitance and produces a plasma resistance $R_P$ and a plasma capacitance $C_P$. A combined transformation processor 360 accepts the outputs of all the other processors 320, 340, 350 and computes the admittance $Y_{plasma}$ through the plasma from the wafer to RF ground and computes the wafer voltage $V_{wafer}$ (or ion energy). From the plasma admittance and from the wafer voltage, the following quantities are computed: wafer current $I_{wafer}$, the etch rate and the ion density.

In summary, electrical measurements are made at the output of the impedance match circuit 130. The transmission line transformation processor 320 transforms these measurements at the near end of the cable 210 to an admittance at the far end. The grid to ground transformation processor 340 provides the transformation from the ground plane 115-4 near the far end of the cable to the conductive grid 115-1. The grid-to-wafer transformation processor 350 provides the transformation from the conductive grid 115-2 to the wafer 120. Using all of the foregoing transformations, the combined transformation processor 360 provides the transformation across the plasma in the form of the plasma admittance. From the plasma admittance, various performance parameters such as etch rate and plasma ion density are computed.

The transmission line model 330, the model of the grid-to-ground capacitance 345 and the model 355 of the grid-to-wafer capacitance are not necessarily a part of the measurement instrument 140. Or, they may be memories within the measurement instrument 140 that store, respectively, the coaxial cable parameters ($V_{ch}$ and $Z_{ch}$), the grid-to-ground capacitance parameters (gap, $\in_D$, $\tan_D$ and radius) and the grid-to-wafer capacitance parameters ($gap_P$, $\in_P$, $\tan_P$ and radius).

Figure 4:
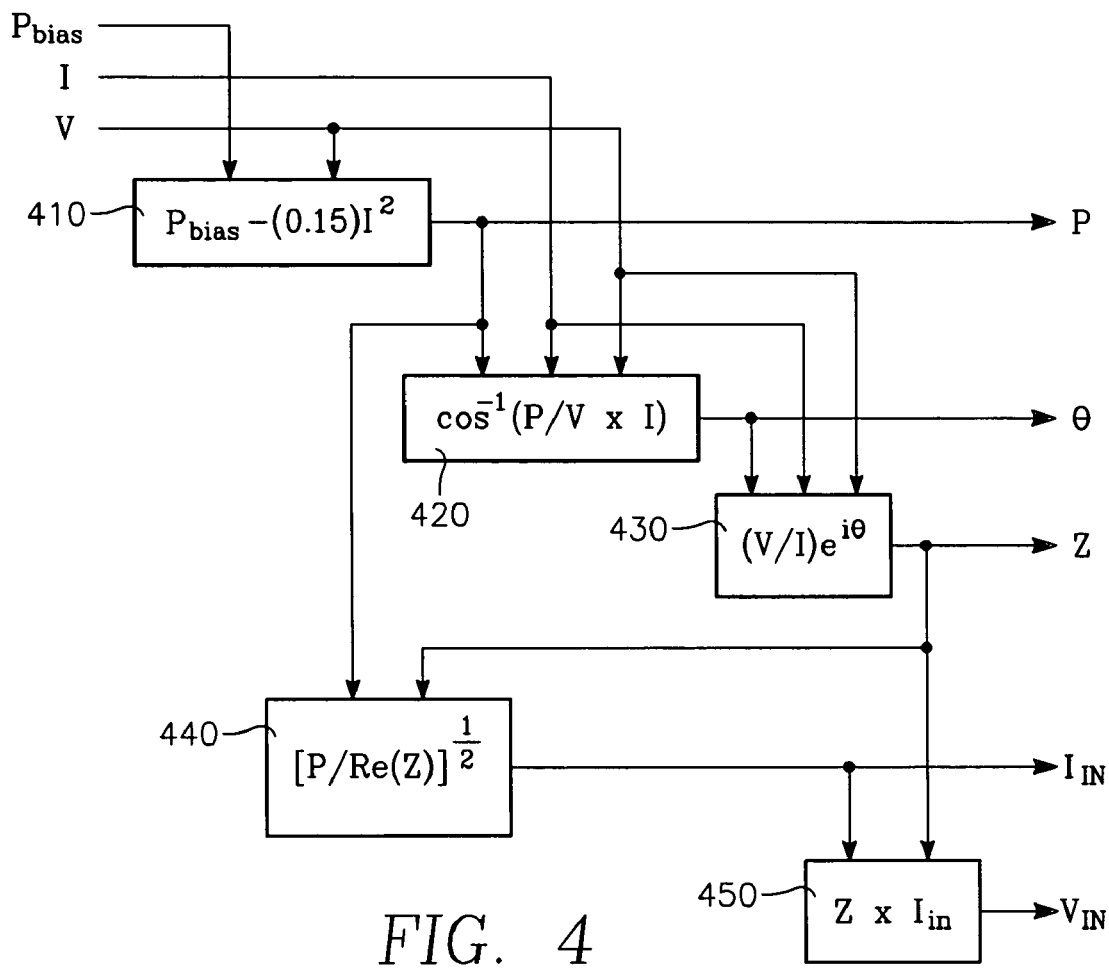
FIG. 4 illustrates an input phase processor of the measurement instrument of FIG. 3.

FIG. 4 illustrates the structure of the input phase processor 310 of FIG. 3. A delivered power arithmetic logic unit (ALU) 410 computes delivered power P from the outputs I and $P_{bias}$ from the impedance match sensing circuit 132 as $P_{bias}-(0.15)$ $I^2$. A phase angle ALU 420 computes phase angle θ from the delivered power P and from V and I as $\cos^{-1}(P/VHI)$. An impedance ALU 430 computes the complex impedance Z as $(V/I)e^{i\theta}$, where $i=(-1)^{1/2}$. An input current ALU 440 computes the input current $I_{in}$ to the coaxial cable 210 as $[P/Re(Z)]^{1/2}$. An input voltage ALU 450 computes the input voltage $V_{in}$ to the coaxial cable 210 as $ZHI_{in}$.

Figure 5:
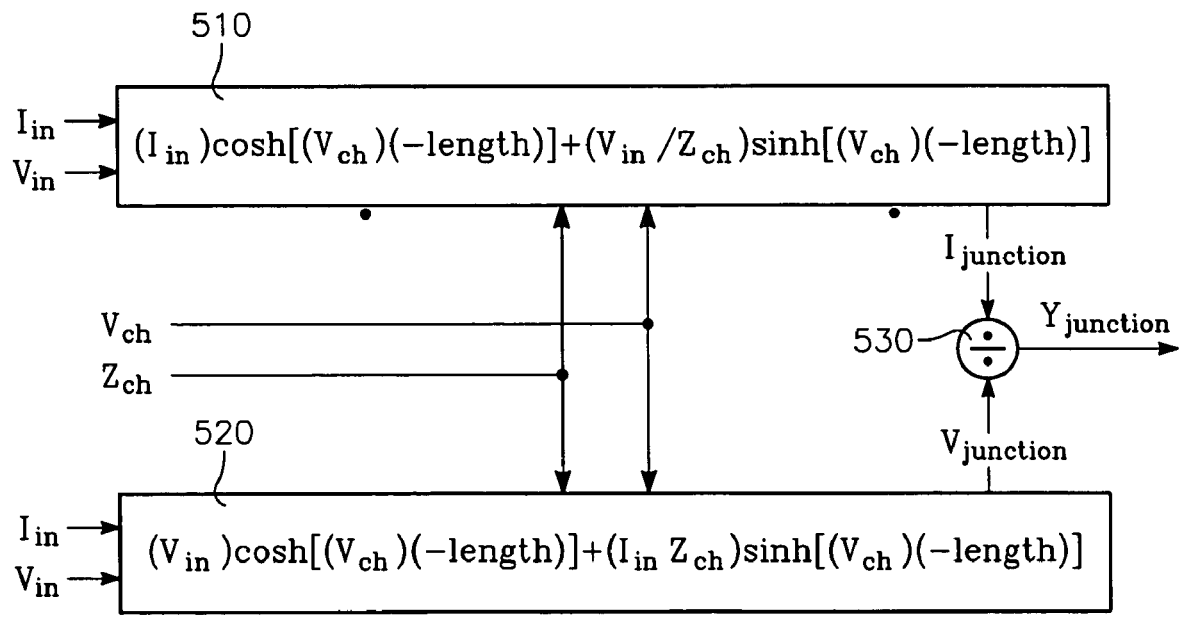
FIG. 5 illustrates a transmission line transformation processor in the measurement instrument of FIG. 3.

FIG. 5 illustrates the structure of the transmission line transformation processor 320 of FIG. 3. The transmission line processor receives $I_{in}$ and $V_{in}$ as inputs from the input phase processor 310 of FIG. 4 and uses the transmission line model parameters $V_{ch}$ and $Z_{ch}$ (from the transmission line model or memory 330 of FIG. 3) to compute the admittance $Y_{junction}$ as follows: A junction current ALU 510 computes the current $I_{junction}$ at the junction of the coaxial cable 210 and the grid 115-1 (FIG. 1) as:

($I_{in}$)cos h[($V_{ch}$)(−length)]+($V_{in}/Z_{ch}$)sin h[($V_{ch}$) (−length)].

A junction voltage ALU 520 computes the voltage $V_{junction}$ at the junction between the coaxial cable 210 and the grid 115-1 as:

$$(V_{in})\cos h[(V_{ch})(-\text{length})]+(I_{in}Z_{ch})\sin h[(V_{ch})(-\text{length})].$$

A divider 530 receives $I_{junction}$ and $V_{junction}$ computes $Y_{junction}$ as $I_{junction}/V_{junction}$. It should be noted that each of the electrical quantities in the foregoing computations (current, voltage, impedance, admittance, etc.) is a complex number having both a real part and an imaginary part.

Figure 6:
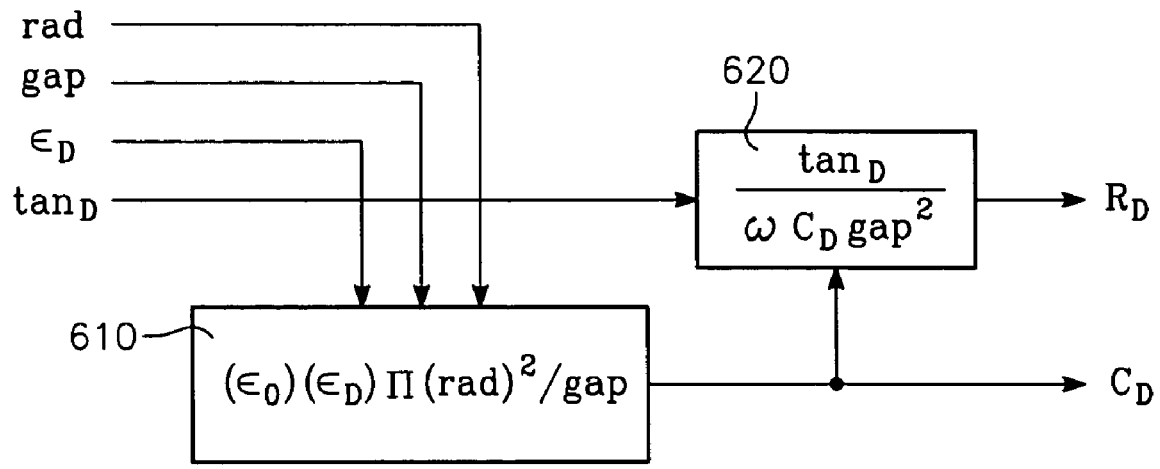
FIG. 6 illustrates a grid-to-ground transformation processor in the measurement instrument of FIG. 3.

FIG. 6 illustrates the structure of the grid-to-ground transformation processor 340 of FIG. 3. The grid-to-ground transformation processor 340 receives the parameters gap, $\in_D$, $\tan_D$ and rad (the wafer radius) from the grid-to-ground model or memory 345 of FIG. 3 computes the dielectric resistance $R_D$ and the dielectric capacitance $C_D$. The dielectric capacitance $C_D$ is computed by a CD ALU 610 as follows:

$$(\in_0)(\in_D)\pi(\text{rad})^2/\text{gap}$$

where $\in_0$ is the electrical permittivity of free space. An RD ALU 620 uses the value of $C_D$ from the CD ALU 610 and computes the dielectric resistance $R_D$ as follows:

$$(\tan_D)/(\omega C_D \text{gap}^2)$$

where $\omega$ is the angular frequency of the bias RF generator 125 of FIG. 2.

Figure 7:
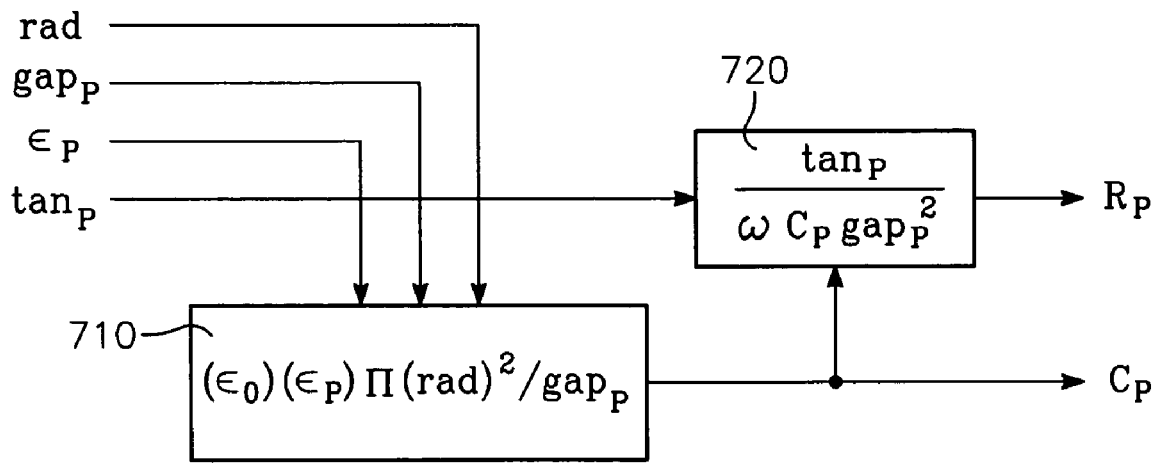
FIG. 7 illustrates a grid-to-wafer transformation processor in the measurement instrument of FIG. 3.

FIG. 7 illustrates the structure of the grid-to-wafer transformation processor 350 of FIG. 3. The grid-to-wafer transformation processor 350 receives the parameters $\text{gap}_P$, $\in_P$, $\tan_P$ and rad from the grid-to-wafer model or memory 355 of FIG. 3 and computes the plasma resistance $R_P$ and the plasma capacitance $C_P$. The plasma capacitance $C_P$ is computed by a CP ALU 710 as follows:

$$(\in_0)(\in_P)\pi(\text{rad})^2/\text{gap}_P$$

where $\in_0$ is the electrical permittivity of free space. An RP ALU 720 uses the value of $C_P$ from the CP ALU 710 and computes the plasma resistance $R_P$ as follows:

$$(\tan_P)/(\omega C_P \text{gap}_D^2)$$

where $\omega$ is the angular frequency of the bias RF generator 125 of FIG. 2.

Figure 8:
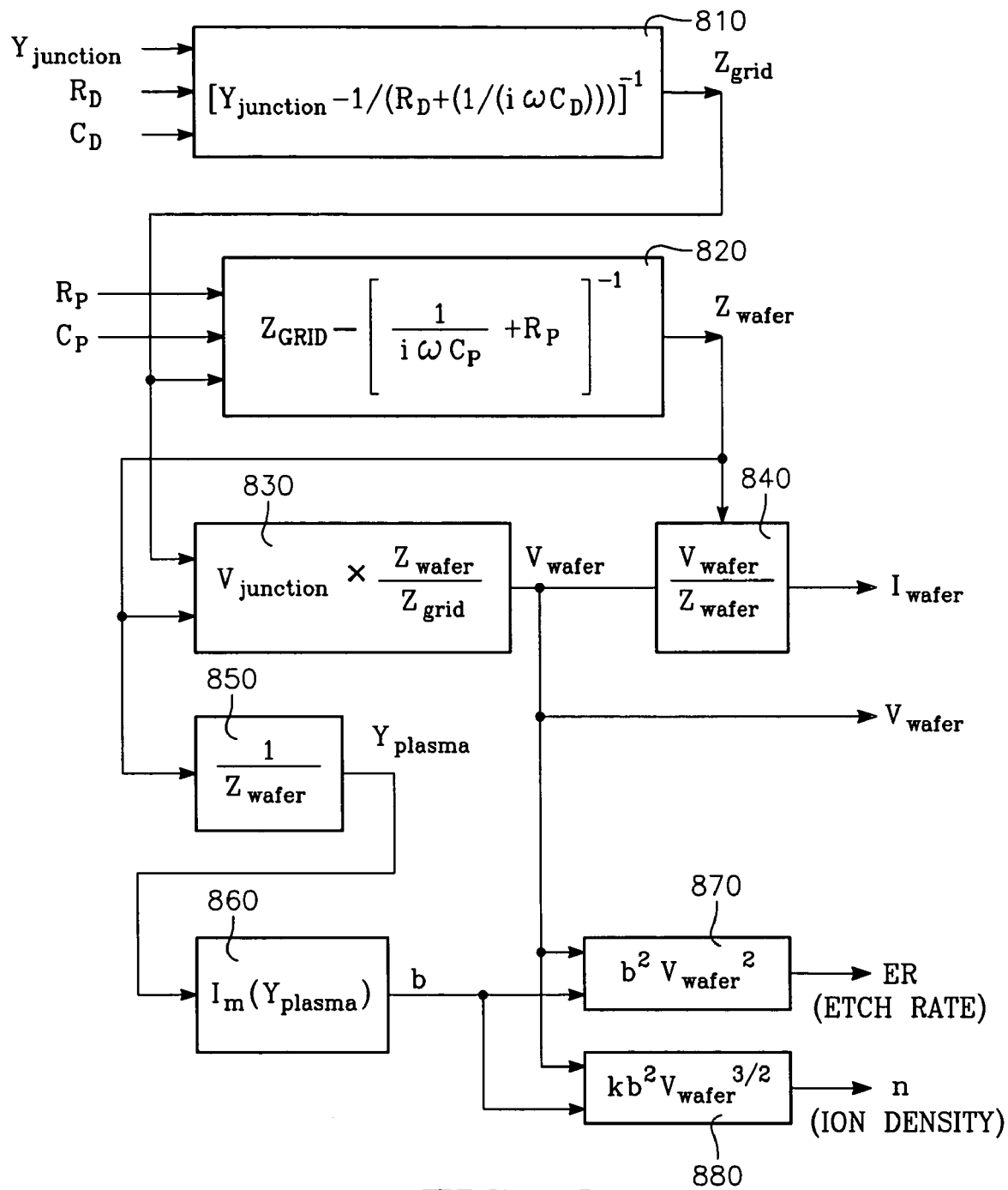
FIG. 8 illustrates a combined transformation processor in the measurement instrument of FIG. 3.

FIG. 8 illustrates the structure of the combined transformation processor 360 of FIG. 3. The combined transformation processor 360 receives the parameters $R_D$, $C_D$ from the processor 340 of FIG. 3, receives the parameters $R_P$, $C_P$ from the processor 350 of FIG. 3 and receives the parameter $Y_{junction}$ from the processor 320 of FIG. 3. A grid impedance ALU 810 computes $Z_{grid}$ (the impedance at the grid 115-1 of FIG. 2) as follows:

$$[Y_{junction}-1/(R_D+(1/(i\omega C_D)))]^{-1}$$

A wafer impedance ALU 820 uses the output of the grid impedance ALU 810 to compute $Z_{wafer}$ (the impedance at the wafer 120 of FIG. 2) as follows:

$$Z_{grid}-1/(R_P+(1/(i\omega C_P)))$$

A wafer voltage ALU 830 uses the outputs of both ALU=s 810 and 820 and $V_{junction}$ from the divider 530 of FIG. 5 to compute the voltage on the wafer 120 of FIG. 2, $V_{wafer}$, as $V_{junction} Z_{wafer}/Z_{grid}$. A wafer current ALU 840 uses the outputs of the ALU=s 820 and 830 to compute the wafer current $I_{wafer}$ as $V_{wafer}/Z_{wafer}$. An admittance ALU 850 uses the output of the ALU 820 to compute the admittance of the plasma, $Y_{plasma}$, as $1/Z_{wafer}$. A susceptance ALU 860 uses the output of the ALU 850 to compute the plasma susceptance, b, as Im$(Y_{plasma})$. An etch rate ALU 870 uses the wafer voltage from the ALU 830 and the susceptance from the ALU 860 to compute the etch rate as $b^2 V_{wafer}^2$. An ion density ALU 880 uses the same outputs to compute the ion density as $kb^2 V_{wafer}^{3/2}$, where k is a constant given by:

$$(2^{3/2}/3^2)(1/[q\in_0 A^2\pi^2 f^2 T_e^2])$$

where q is the electron charge, A is the area of the wafer 120 of FIG. 2, f is the frequency of the bias power generator 125 of FIG. 2 and $T_e$ is the electron temperature in volts. This relationship between ion density and the measured quantities b and $V_{wafer}$ follows from an approximate formula for the plasma susceptance and a formula for the plasma sheath thickness. The plasma susceptance may be approximated as $\in A\omega/\lambda$, where $\in$ is the electrical permittivity within the plasma, A is the electrode area, $\omega$ is the angular frequency of the bias power signal and $\lambda$ is the plasma sheath thickness. The plasma sheath thickness may be approximated as $[T_e/(q\eta)]^{1/2}[2V_{wafer}/T_e]^{3/4}$, where $T_e$ is electron temperature, q is the electron charge and $\eta$ is ion density. Substituting the expression for sheath thickness into the expression for the susceptance and solving for ion density yields an expression for ion density as a function of susceptance and wafer voltage.

Figure 9:
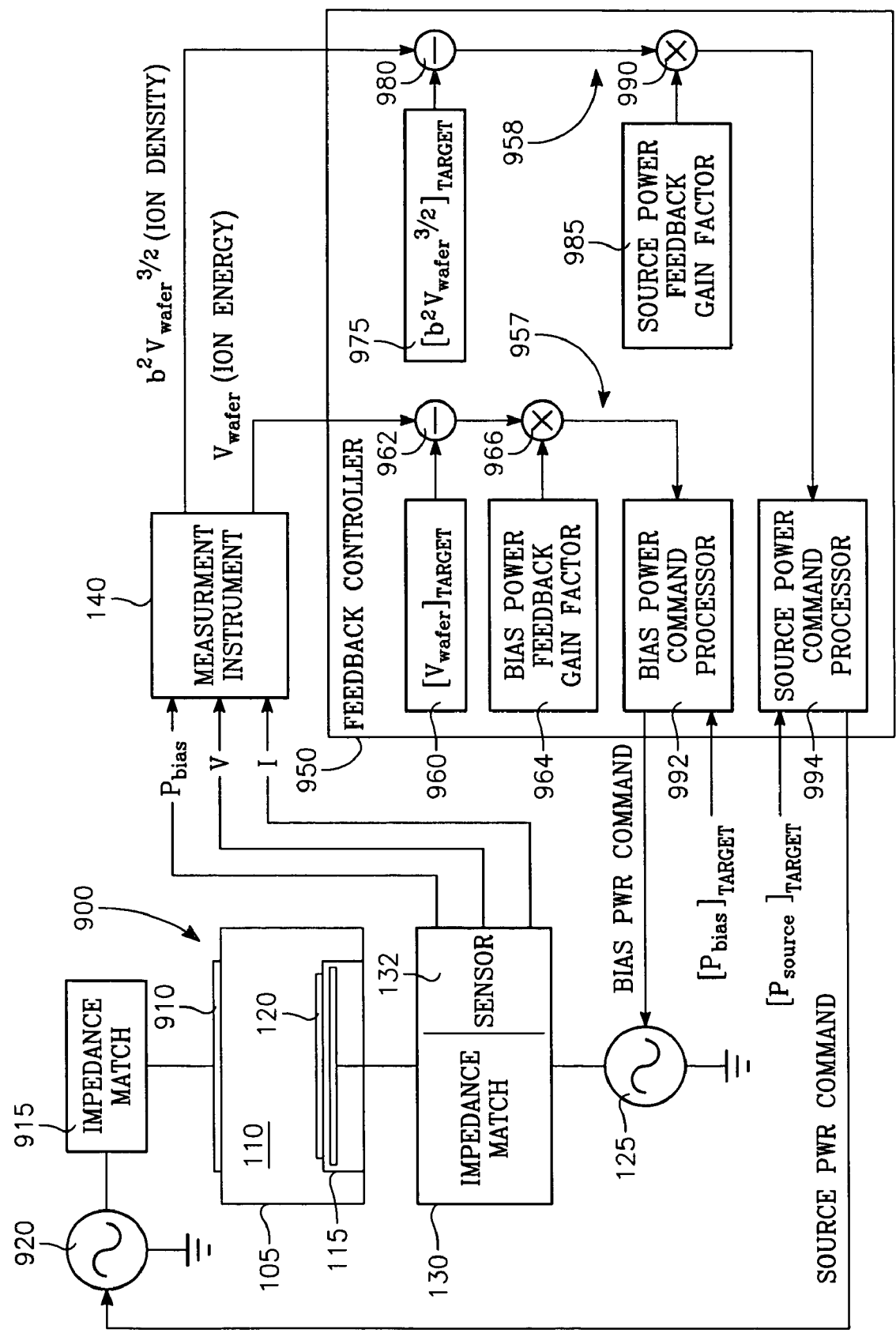
FIG. 9 illustrates a process feedback control system for a plasma reactor that includes the measurement instrument of FIG. 3.

Process Feedback Control System:

FIG. 9 illustrates a process feedback control system that uses the measurement instrument 140 of FIG. 3. A plasma reactor 900 includes all of the features of the plasma reactor 100 of FIG. 1, and in addition includes an overhead RF source power applicator 910 connected through an impedance match circuit 915 to an RF source power generator 920. The RF source power applicator 910 may be, for example, a ceiling electrode that is insulated from the grounded chamber enclosure 105. The power level of the RF plasma source power generator 920 generally controls the plasma ion density while the power level of the RF plasma bias power generator 125 generally controls the ion energy at the wafer surface. The measurement instrument 140 receives the power, voltage and current outputs from the sensor circuit 132 of the impedance match circuit 130. From these quantities, the measurement instrument 140 computes the plasma susceptance b and computes the wafer voltage $V_{wafer}$, which is output as a measurement signal. These computations are carried out in the manner described above with reference to FIG. 5. The measurement instrument 140 can then compute the ion density and/or the etch rate from b and $V_{wafer}$, in the manner described above with reference to FIG. 5. At least two of the three measurement signals thus produced by the measurement instrument 140 can be used in a feedback control loop.

A feedback controller 950 uses the measurement signals from the measurement instrument 140 to create feedback signals to control the power level of the RF plasma bias power generator 125 and the power level of the RF plasma source power generator 920. The ion energy at the wafer surface, which is equivalent to the wafer voltage $V_{wafer}$, is directly controlled by the power level of the bias power generator 125. Therefore, the wafer voltage measurement signal from the measurement instrument 140 (i.e., $V_{wafer}$ from the ALU 830 of FIG. 8) is used by the feedback controller 950 to control the bias power generator 125 in a bias power feedback control loop 957. The source power generator 920, on the other hand, directly controls plasma ion density. Therefore, plasma ion density measurement signal from the measurement instrument 140 (i.e., $kb^2 V_{wafer}^{3/2}$ from the ALU 880 of FIG. 8) is used by the feedback controller 950 to control the source power generator 920 in a source power feedback control loop 958.

The bias power feedback control loop 957 includes a memory 960 that stores a selected or desired target value of the wafer voltage or ion energy, $[V_{wafer}]_{TARGET}$. A subtractor 962 subtracts this target value from the sensed wafer voltage $V_{wafer}$ to produce an error signal. The gain of the bias power feedback loop 957 is determined by a bias power feedback gain factor stored in a memory 964. A multiplier 966 multiplies the error signal from the subtractor 962 by the gain factor in the memory 964 to produce a correction signal used to control the power level of the bias power generator 125. The path of the bias power feedback control loop 957 is completed by the V, I and $P_{bias}$ signals applied to the measurement instrument 140 to produce the measurement signal $V_{wafer}$ representing the wafer voltage.

The source power feedback control loop receives from the measurement instrument 140 the sensed ion density value $b^2 V_{wafer}^{3/2}$. A memory 975 stores a selected or desired target value of the ion density, $[b^2 V_{wafer}^{3/2}]_{TARGET}$. A subtractor 980 computes the difference between the measured ion density and the ion density target value to produce an error signal. The gain of the source power feedback control loop 958 is determined by a source power feedback gain factor stored in a memory 985. A multiplier 990 multiplies the error signal from the subtractor 980 by the gain factor from the memory 985 to produce a correction signal. This correction signal is used to control the power level of the RF source power generator 920. The path of the source power feedback control loop 958 is completed by the V, I and $P_{bias}$ signals applied to the measurement instrument 140 to produce the measurement signal $b^2 V_{wafer}^{3/2}$ representing the ion density.

At the start of a plasma process step such as an etch process step, initial values for the power levels $P_S$ and $P_B$ of the RF source power generator 920 and the RF bias power generator 125, respectively, can be specified. If these initial values are sufficiently close to the optimum values, this feature can avoid unduly large initial corrections by the feedback controller 950. For this purpose, the bias power feedback loop 957 includes a bias power command processor 992 coupled to receive the feedback correction signal from the multiplier 957 and to receive a target value for the bias power, $[P_{bias}]_{TARGET}$. Before plasma processing begins, there is no feedback signal, and the bias power command processor 992 sets the power level of the bias power generator 125 to the initial target value $[P_{bias}]_{TARGET}$. Once processing begins and a feedback signal is present, the bias power command processor 992 controls the bias power in accordance with the feedback correction signal from the multiplier 966 rather than the bias power target value.

Similarly, the source power feedback loop 958 includes a source power command processor 994 coupled to receive the feedback correction signal from the multiplier 990 and to receive a target value for the source power, $[P_{source}]_{TARGET}$. Before plasma processing begins, there is no feedback signal, and the source power command processor 994 sets the power level of the source power generator 920 to the initial target value $[P_{source}]_{TARGET}$. Once processing begins and a feedback signal is present, the source power command processor 994 controls the source power in accordance with the feedback correction signal from the multiplier 990 rather than the source power target value.

In accordance with another aspect, the source and bias power command processors 992, 994 can be instructed by the user to ignore their respective feedback control loops 957, 958 throughout much or all of the process step and instead maintain the source and bias power levels at the specified target values $[P_{source}]_{TARGET}$ and $[P_{bias}]_{TARGET}$. The user can change these values from time to time during processing.

Figure 10:
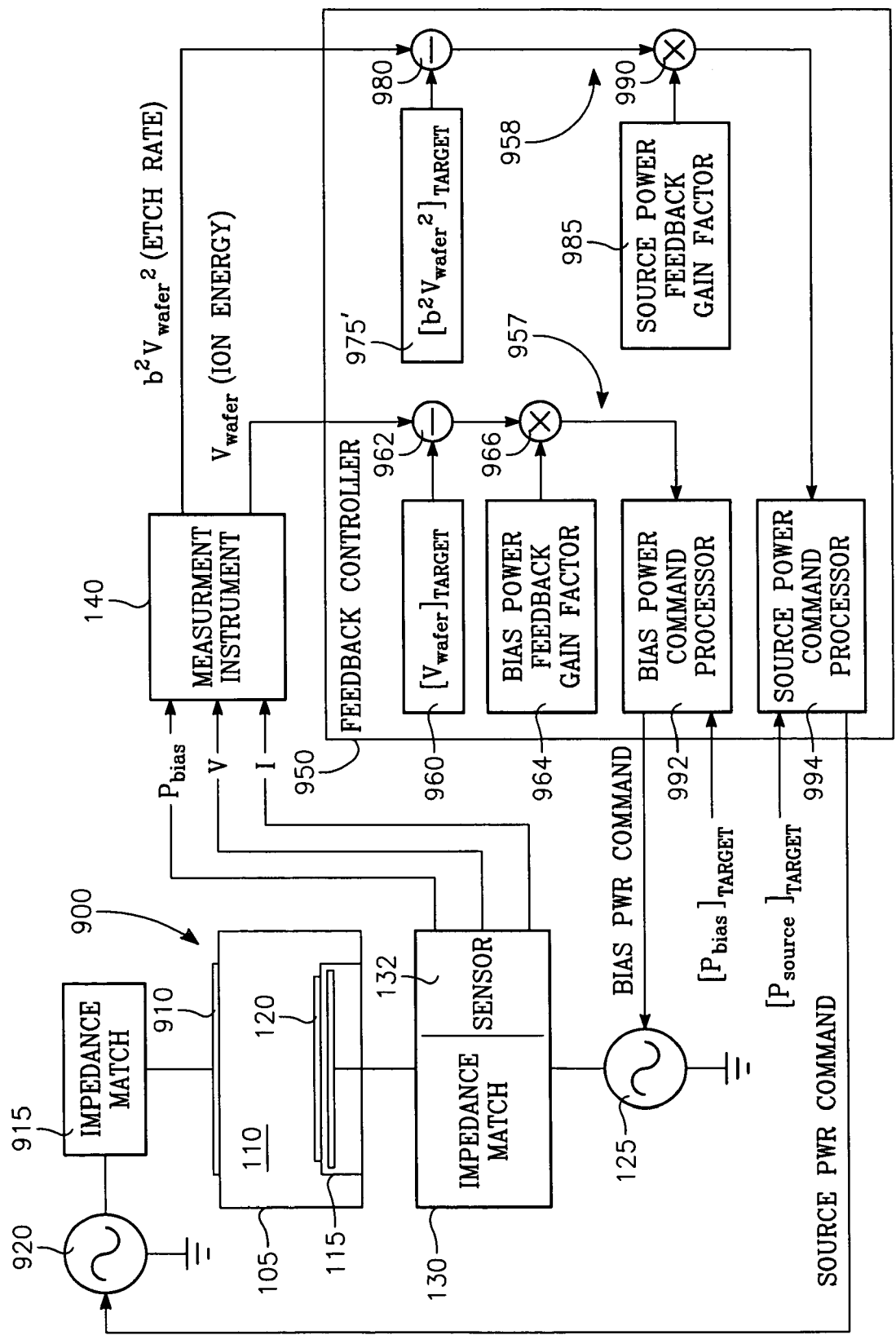
FIG. 10 illustrates an alternative implementation of the process feedback control system.

Referring to FIG. 10, the feedback control processor 950 may employ the etch rate rather than the ion density as the measured parameter in the source power feedback control loop 958. In the measurement instrument 140, the etch rate measurement signal is taken from the ALU 870 of FIG. 8 that computes $b^2 V_{wafer}^2$. In FIG. 10, a memory 975' (in lieu of the memory 975 of FIG. 9) stores a target value of the etch rate, $[b^2 V_{wafer}^2]_{TARGET}$. The subtractor 980 operates as described with reference to FIG. 9 to produce an error signal. The remainder of the source power feedback control loop of FIG. 10 generally is the same as in FIG. 9.

Process Set Point Controller:

The feedback controller 950 requires a number of target values for various process control parameters. Specifically the feedback controller 950 of FIG. 9 has a memory 975 storing the target value for the ion density, $[b^2 V_{wafer}^{3/2}]_{TARGET}$, and a memory 960 storing the target value for the ion energy (or, equivalently, wafer voltage), $[V_{wafer}]_{TARGET}$. In the feedback controller of FIG. 10, the memory 975 is replaced by the memory 975' storing the target value for the etch rate, $[b^2 V_{wafer}^2]_{TARGET}$. In addition, the feedback controller 950 can employ initial target values $[P_{source}]_{TARGET}$ and $[P_{bias}]_{TARGET}$ for the source and bias power levels respectively to initialize the feedback controller 950, as discussed above. The selection or optimization of these target values can be left to the user's efforts, which may involve an undue amount of trial and error and may be unreliable. Typically, a user who wishes to achieve certain process results (e.g., a certain etch rate, a certain ion energy, a reduction in etch processing artifacts such as striations, a reduction in heating due to wafer current, etc.) must conduct a time-consuming program of trial and error experiments to find the optimum process control parameters values to achieve the desired results. For this reason, the alteration of an existing process or the design of a new process must be undertaken over a very long development period.

Figure 11:
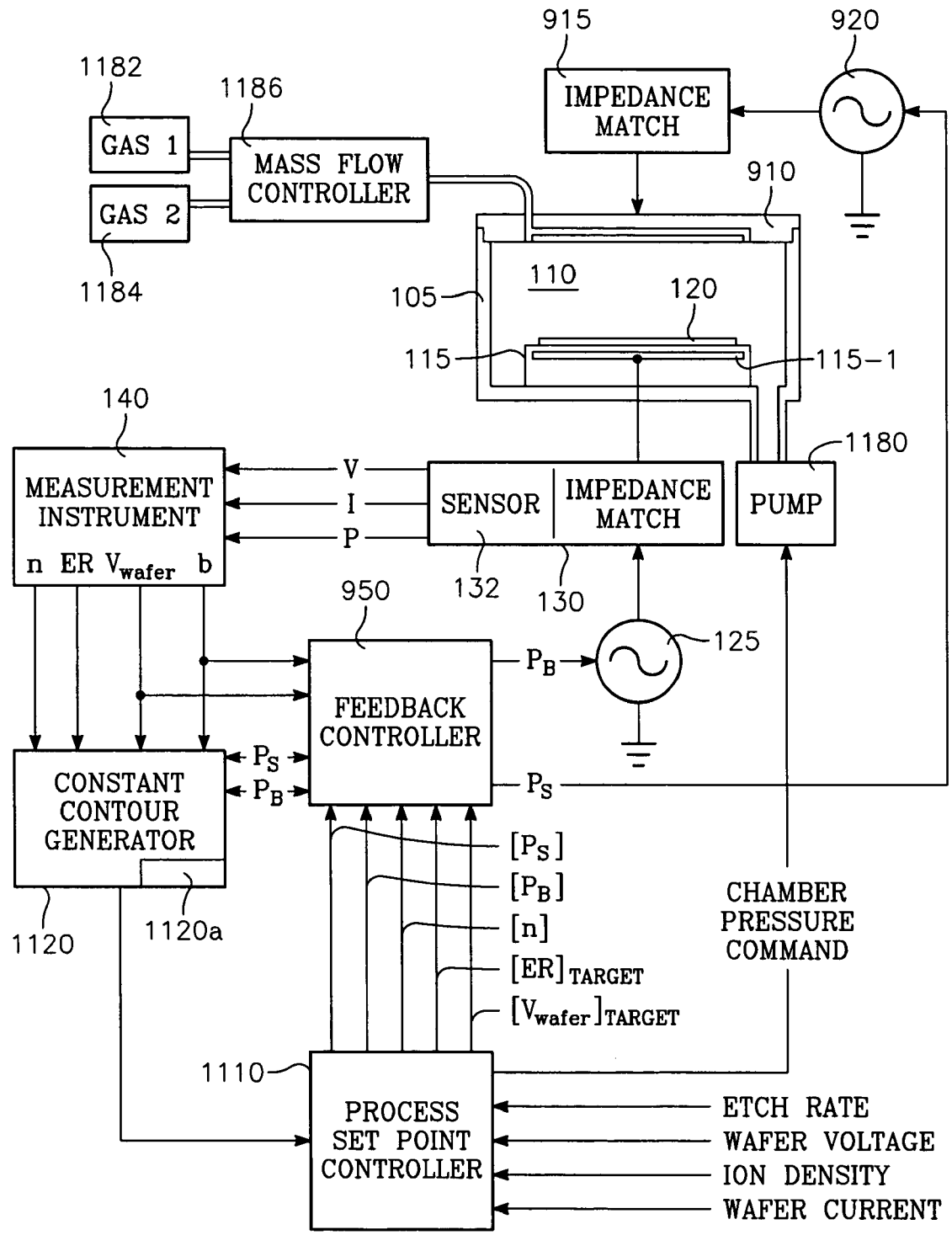
FIG. 11 illustrates the measurement instrument of FIG. 3, a constant contour generator and a process set point controller connected in a system with a plasma reactor.

In order to overcome this limitation, a process set point controller 1110 employed in the reactor of FIG. 11 automatically and quickly (or instantaneously) finds the optimum target values of process control parameters based upon the user's selection of values for various performance parameters. For example, the process set point controller 1110 may determine the target values $[P_{source}]_{TARGET}$ and $[P_{bias}]_{TARGET}$ based upon a desired etch rate and/or a desired wafer voltage or other performance parameter specified by the user. Thus, a new process recipe can be designed nearly instantaneously. For present plasma reactors, this can take place in milliseconds, but could be made to be as fast as microseconds if needed.

There are many process control parameters (i.e., characteristics of the reactor under direct user control such as chamber pressure, source and bias power levels, etc.) and many process performance parameters (i.e., characteristics of the plasma and process not susceptible of direct control such as etch rate, ion density, ion energy, wafer current, etc.). A user can specify any one or more of these performance parameters as an objective for a given process. Any one or group of or all of the control parameters can be used to achieve the desired levels of the performance parameters chosen by the user. The question is whether or not the effects of some of the control parameters might be dependent upon others of the control parameters in controlling the performance parameters chosen by the user. Thus, the problem of selecting the right set of control parameters to achieve the desired results in the chosen performance parameters is complex and there appears to be no particularly optimum choice.

However, I have discovered that the source power and the bias power control the performance parameters of interest and do so in an independent manner. That is, source power $P_{source}$ and bias power $P_{bias}$ are independent variables and may be thought of as orthogonal entities forming a two-dimensional control space in which control of the performance parameters may be exercised with such versatility that no alteration of the other control parameters is required. This discovery greatly reduces the problem to only two variables.

Therefore, the following description will concern a control system in which the control parameters, with the exception of $P_{source}$ and $P_{bias}$, are held constant during processing. Thus, process control parameters including chamber pressure, gas composition, gas flow rate, source power frequency, bias power frequency, etc., are held constant. The source power and bias power levels ($P_{source}$ and $P_{bias}$) are varied to achieve desired values in a specified set of performance parameters (e.g., etch rate and ion density).

The problem of finding target values for the various parameters given a set of user-defined values for a chosen set of performance parameters is solved by the process set point controller 1110 superimposing a set of constant parameter contours in the two-dimensional $P_{source}$-$P_{bias}$ space referred to above. Such constant parameter contours are obtained from a constant parameter contour generator 1120 in FIG. 11. For example, contours of constant ion density (FIG. 12), contours of constant ion energy or wafer voltage (FIG. 13), and contours of constant etch rate (FIG. 14) are employed. How the constant parameter contour generator 1120 produces these contours using the measurement instrument 140 will be described later in this specification. The present description concerns their use by the process set point controller 1110.

Figure 12:
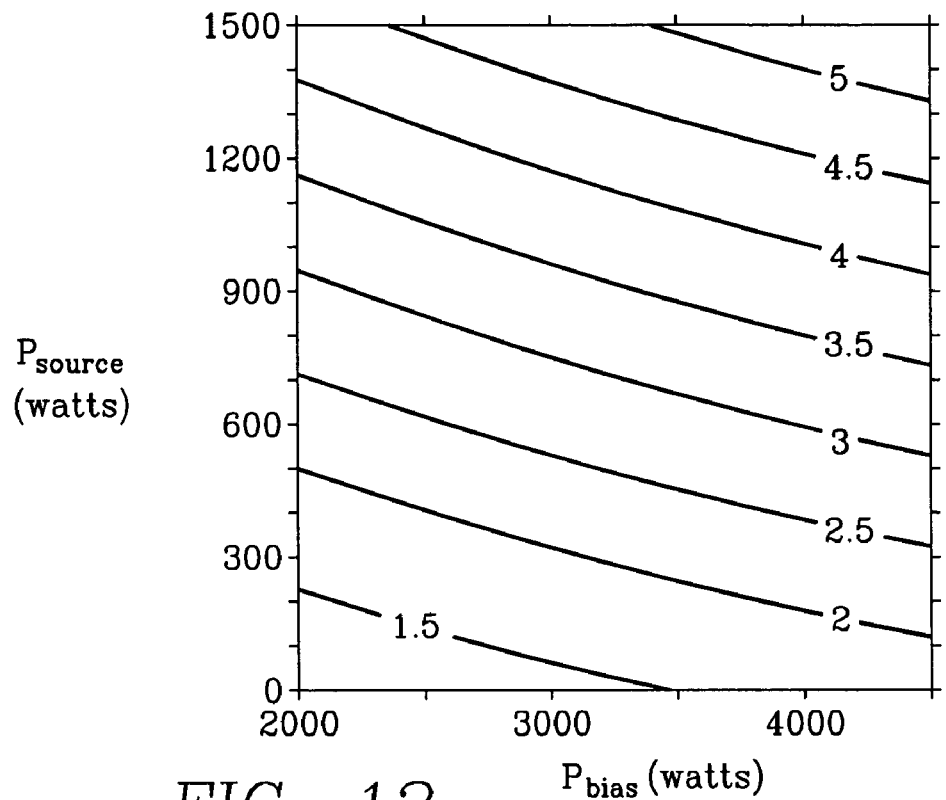
FIGS. 12, 13 and 14 illustrate different contours of constant performance parameter values produced by the system of FIG. 11.
Figure 13:
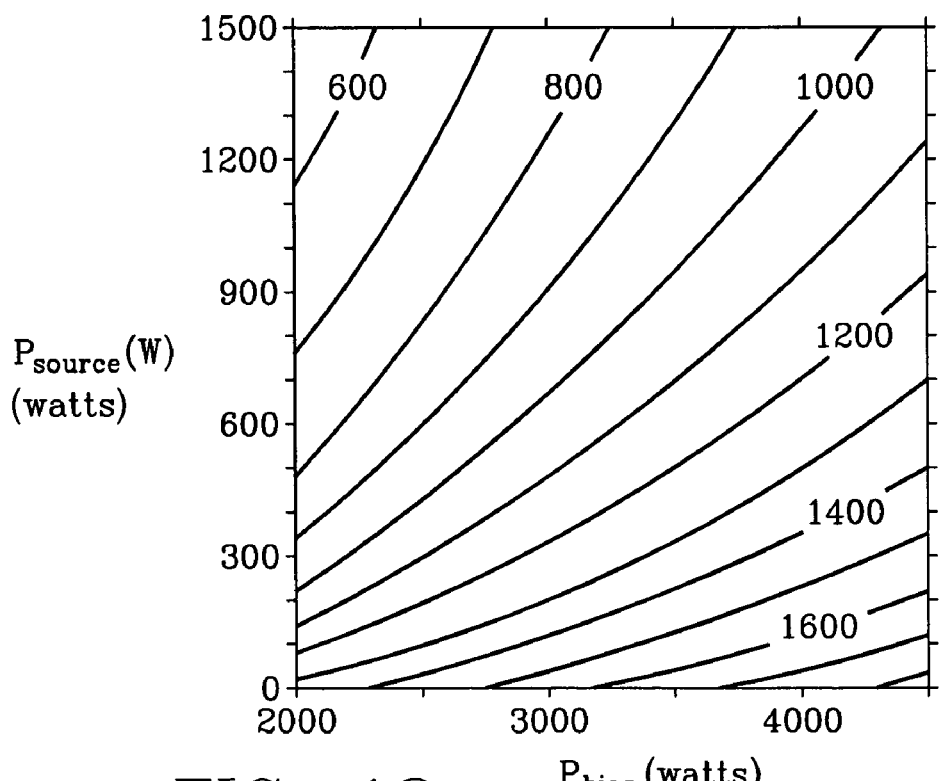
Figure 14:
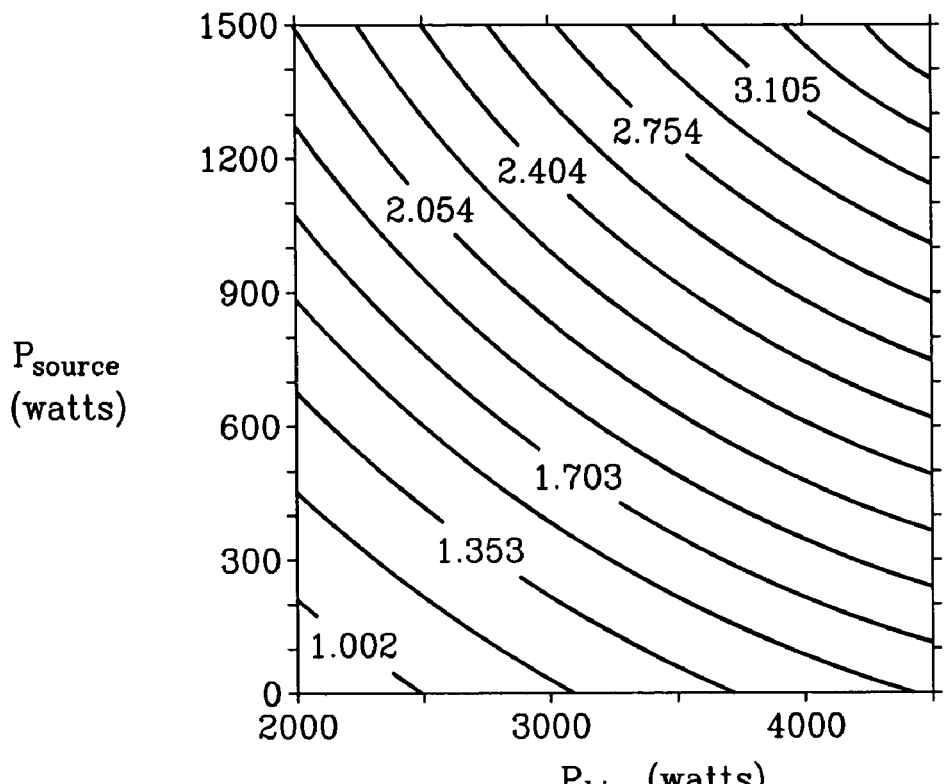

Referring to FIG. 12, a set of contours of constant plasma ion density in $P_{source}$-$P_{bias}$ space for a chamber pressure of 20 mT generally have a small negative slope and a small but positive first derivative d $(P_{source})$/d $(P_{bias})$. The top-most contour corresponds to a constant plasma density of $5H10^{10}$ ions/cm$^3$ while the bottom contour corresponds to $1.5H10^{10}$ ions/cm$^3$. The vertical axis ($P_{source}$) ranges from 0 to 1500 Watts while the horizontal axis ($P_{bias}$) ranges from 2000 to 4500 Watts. Referring to FIG. 13, a set of contours of constant wafer voltage for the same chamber pressure (20 mT) have a positive slope and range from 600 volts (at the top) to 1800 Volts (at the bottom). Referring to FIG. 14, a set of contours of constant etch rate (in arbitrary units, e.g., where k=1) have a large negative slope.

Figure 15:
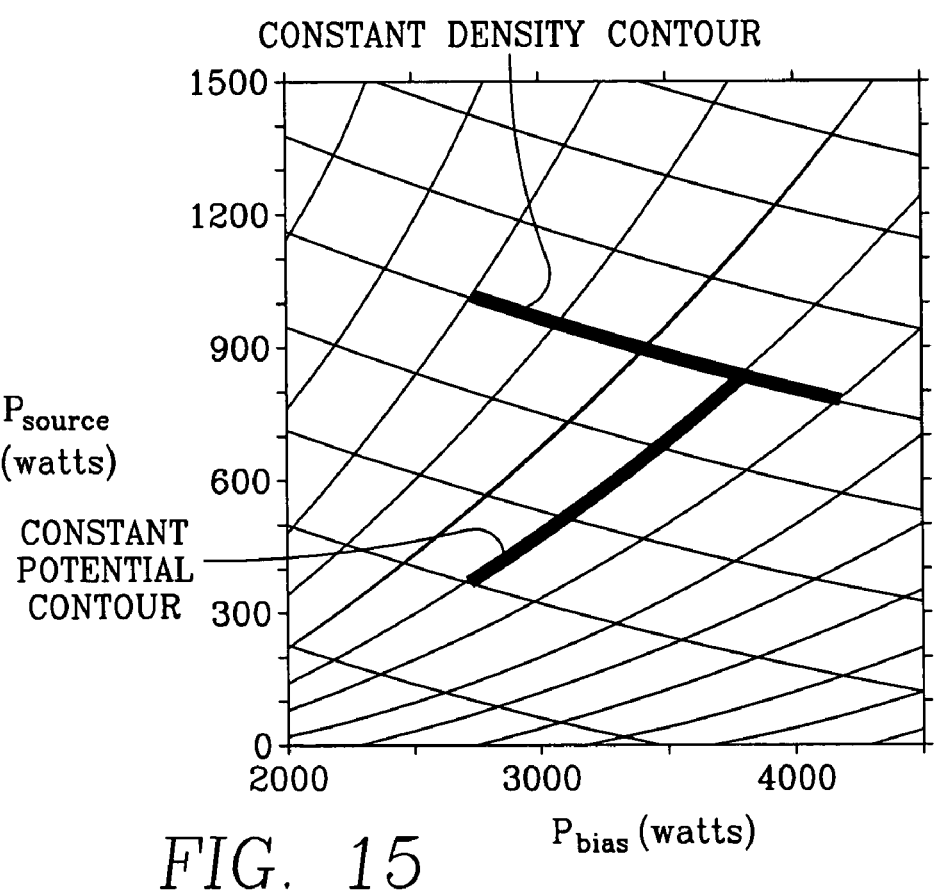
FIG. 15 illustrates a method of finding an optimal operating point at the intersection of different contours of constant parameter values.

The process set point controller 1110 determines how to simultaneously satisfy user-selected values of ion density, ion energy and etch rate. It does this by finding the intersection in $P_{source}$-$P_{bias}$ space of the corresponding contours of FIGS. 12-14. This intersection indicates the optimum target values for source and bias power, namely $[P_{source}]_{TARGET}$ and $[P_{bias}]_{TARGET}$. The problem is somewhat simpler if the user specifies values for only two performance parameters. For example, if the user specifies a wafer voltage of 1100 Volts and an ion density of $3.5H10^{10}$ ions/cm$^3$, then the correct point in $P_{source}$-$P_{bias}$ space is found by superimposing the constant wafer voltage contour for 1100 volts from FIG. 12 and the constant density contour for $3.5H10^{10}$ ions/cm$^3$ from FIG. 13 and finding their intersection in $P_{source}$-$P_{bias}$ space. This procedure is performed by the process set point controller 1110 and is illustrated in FIG. 15 in which the two curves intersect in $P_{source}$-$P_{bias}$ space at the point [850 W, 3750 W]. Therefore, in this example the user's requirements are met by setting the source power level at 850 W and setting the bias power level at 3750 W. Thus, in this case the target values $[P_{source}]_{TARGET}$ and $[P_{bias}]_{TARGET}$ furnished to the source power command processor 994 and bias power command processor 992 of FIG. 9 are 850 Watts and 3750 Watts, respectively.

It should be noted that this deduction of the target values of source and bias power levels may also result in the deduction of a target value for other parameters whose values have not been specified or limited by the user. As an illustration, in the foregoing example, the user has not specified a particular etch rate. However, a target value for the etch rate satisfying the user-selected values for ion density and energy can be found by superimposing the contours of FIG. 14 onto FIG. 15 (or vice versa). The point [850 W, 3750 W] lies on the contour of a constant etch rate of 2.101 (in arbitrary units) of FIG. 14, as indicated by the AX@ symbol in that drawing. Therefore, if the feedback controller of FIG. 10 is employed, then the set point controller 1110 writes an etch rate target value of 2.101 in arbitrary units to the memory 975 of FIG. 10.

An advantage of this feature is that the contours of constant voltage, density, etch rate, etc., are characteristic of the reactor and generally do not change for given process conditions. They may therefore be determined by the constant parameter contour generator 1120 prior to processing and made available to the process set point controller 1110 constantly during use of the reactor, as indicated in FIG. 11. In this way, a target value for a particular parameter may be found instantly or whenever required in the manner illustrated in FIG. 15.

In operation, the bias power command processor 992 and the source power command processor 994 receive the target values $[P_{source}]_{TARGET}$ and $[P_{bias}]_{TARGET}$ from the process set point controller 1110 and receive feedback signals from the multipliers 958 and 957 respectively. During system initialization, the feedback signals are ignored, and the processors 992, 994 put the power levels of the RF generators 125, 920 to the target values $[P_{source}]_{TARGET}$ and $[P_{bias}]_{TARGET}$, respectively. After processing begins, the feedback signals are available and the processors 992, 994 can use the feedback control loops 957, 958 instead of the target values to control the source power and bias power levels. Alternatively, the power command processors 992, 994 may be programmed so that the target values $[P_{source}]_{TARGET}$ and $[P_{bias}]_{TARGET}$ determine the source and bias power levels not only at initialization but also during processing, while the feedback loops 957, 958 are ignored.

FIG. 11 shows that the user can apply to the process set point controller 1110 any one or a combination of user selected values for performance parameters, including etch rate, wafer voltage, ion density and wafer current. In response, the process set point controller 1110 uses the appropriate contours from the contour generator 1120 to produce not only source and bias power target values but, in some cases, target values for other parameters not limited or specified by the user, which may be a target value for the etch rate, the ion density, the ion energy or the wafer current. These target values are furnished to the feedback controller 950 for use in the manner described previously in this specification with reference to FIG. 9.

Figure 16:
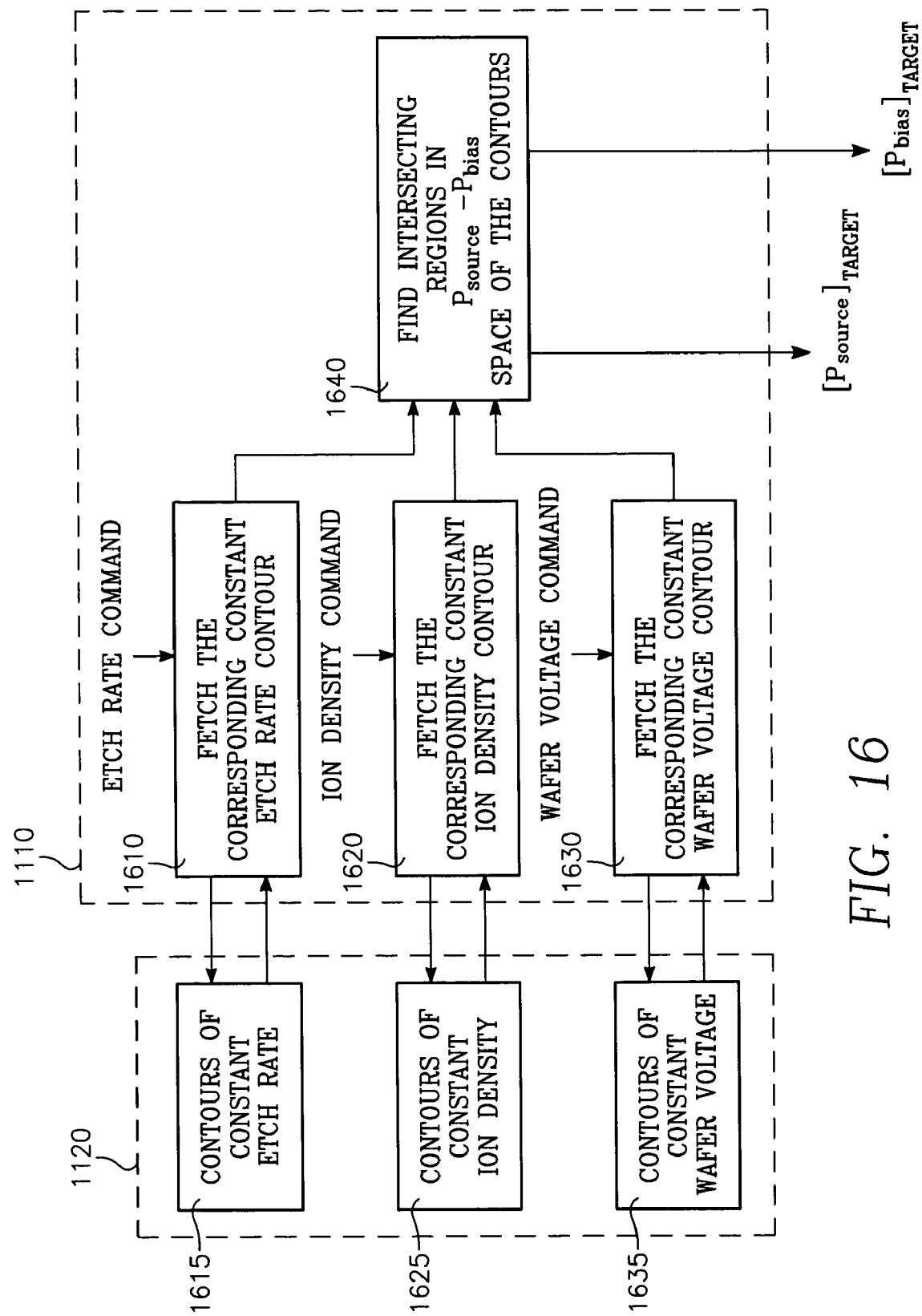
FIG. 16 illustrates the process set point controller in the system of FIG. 11.

FIG. 16 illustrates the structure and operation of the process set point controller 1110 of FIG. 11. A first logic unit 1610 receives an etch rate command (if any) from the user and fetches from a memory 1615 the corresponding contour of constant etch rate in the set of contours of constant etch rates previously generated by the contour generator 1120. A second logic unit 1620 receives an ion density command (if any) from the user and fetches from a memory 1625 the corresponding contour of constant ion density in the set of contours of constant ion density previously generated by the contour generator 1120. A third logic unit 1630 receives a wafer voltage (ion energy) command (if any) from the user and fetches from a memory 1635 the corresponding contour of constant wafer voltage in the set of contours of constant wafer voltage previously generated by the contour generator 1120. A fourth logic unit 1640 finds the intersection point in $P_{source}$–$P_{bias}$ space between any of the contours selected by the logic units 1610, 1620, 1630. This intersection point is output to the feedback controller 950 of FIG. 11 as $[P_{source}]_{TARGET}$, $[P_{bias}]_{TARGET}$.

Figure 17:
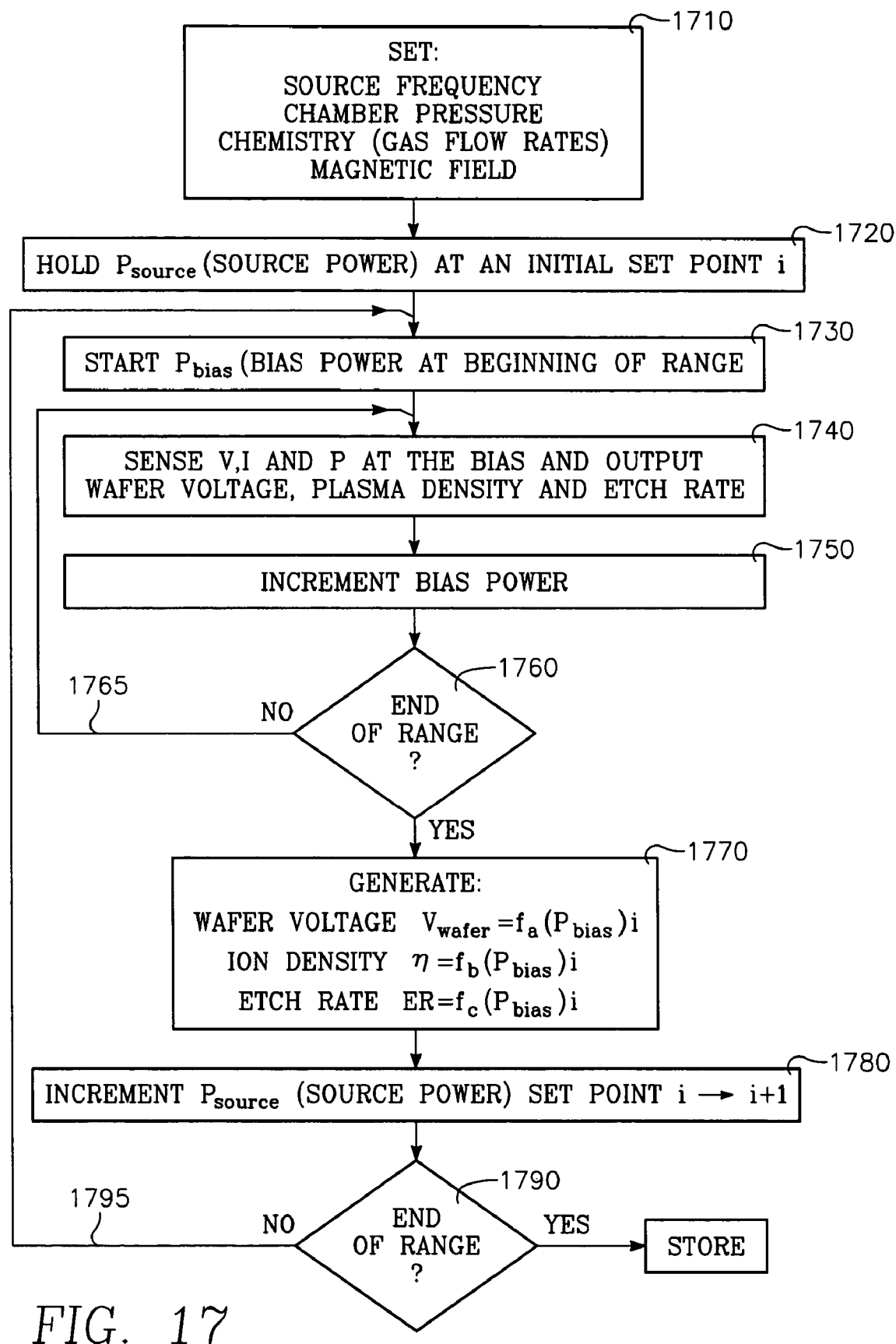
FIGS. 17, 18 and 19 illustrate respective operations performed by the process set point controller of the contour generator in the system of FIG. 11.
Figure 18:
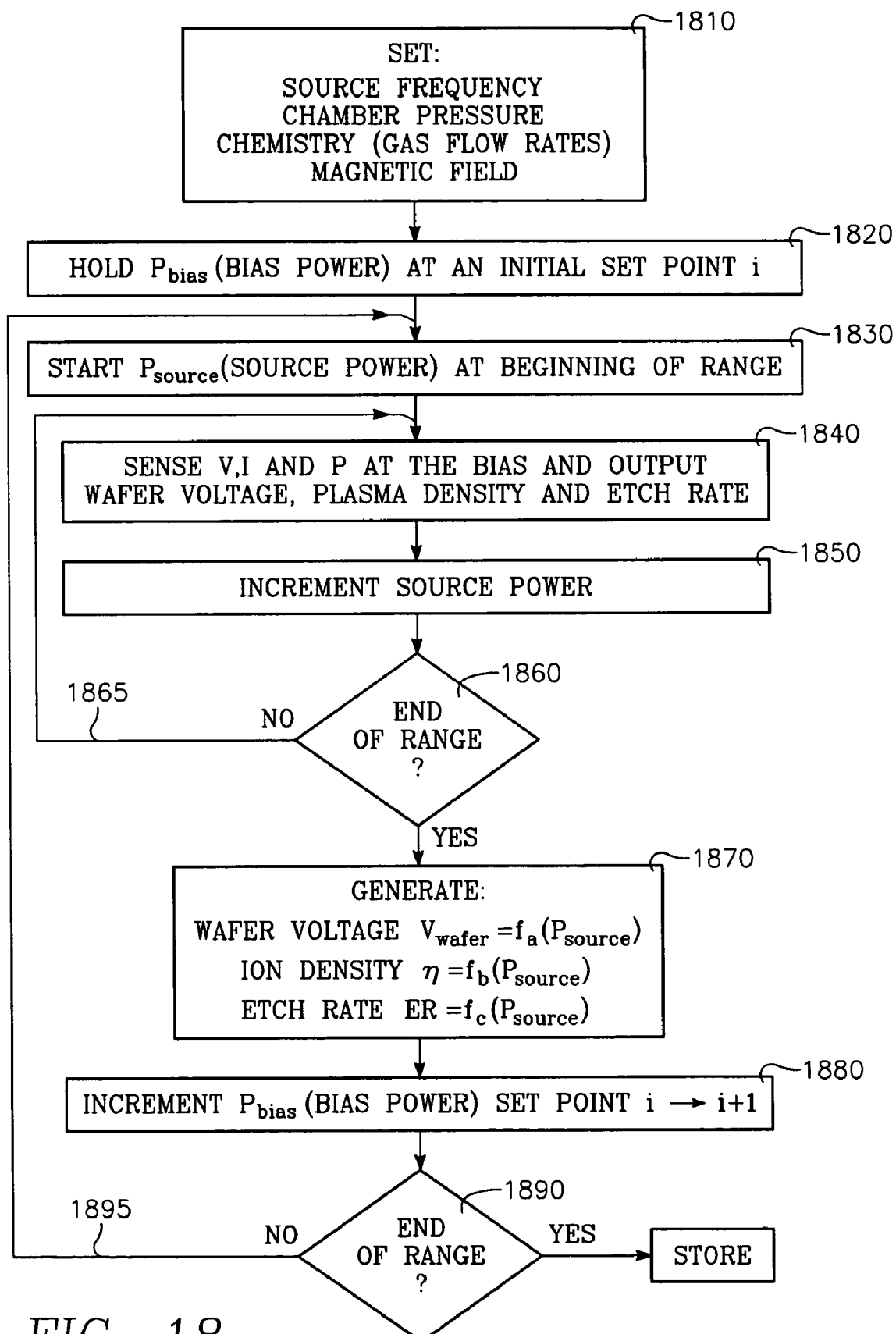
Figure 19:
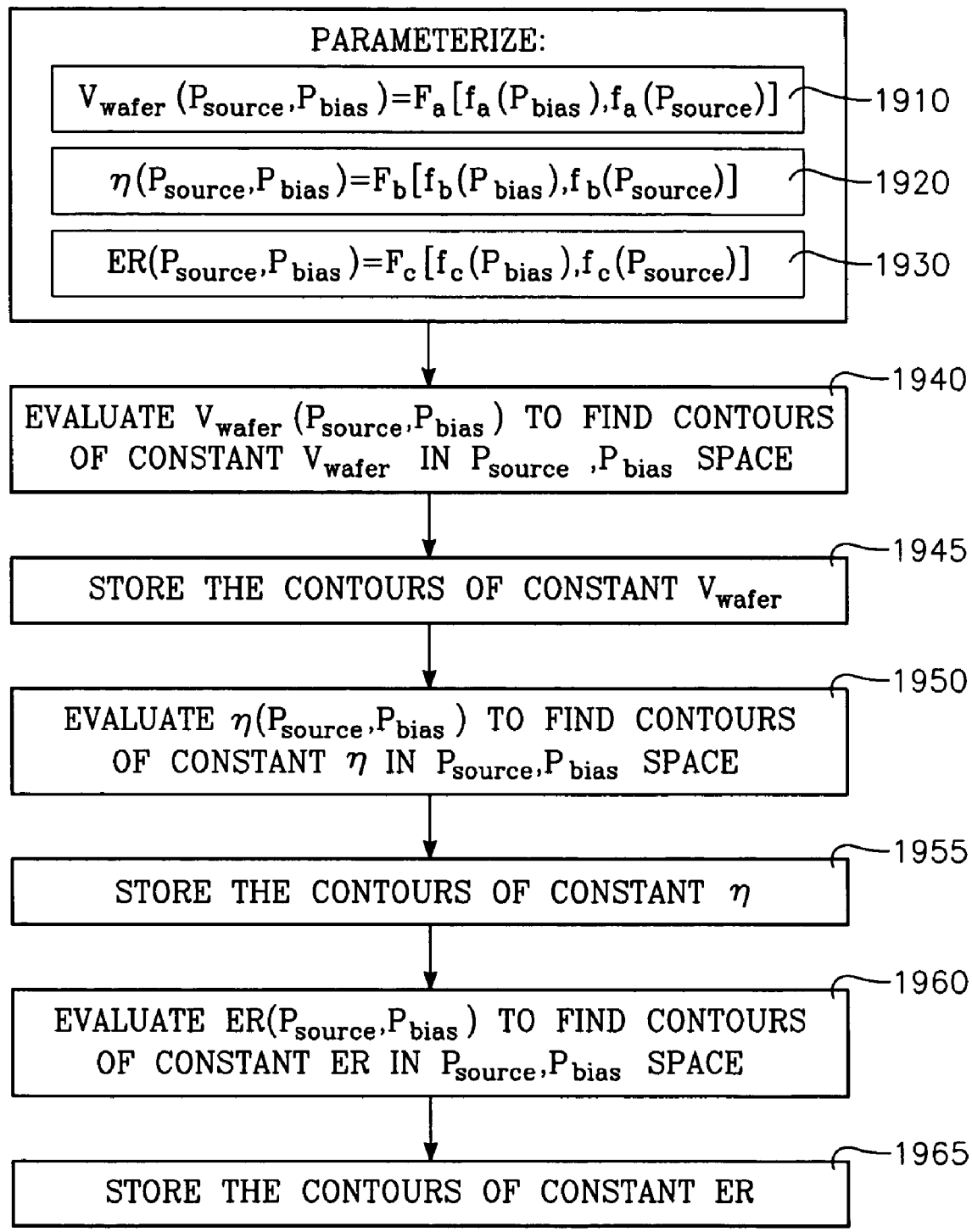

Contour Generator 1120:

Operation of the contour generator 1120 of FIG. 11 is illustrated in FIGS. 17, 18 and 19. FIG. 17 illustrates the operation of the contour generator 1120 in finding functions defining how certain performance parameters vary with bias power. These include functions for the performance parameters of wafer voltage, ion density and etch rate. As will be described below, the observations of changes in wafer voltage, ion density and etch rate with bias power are made for the contour generator 1120 by the measurement instrument 140 using the configuration of FIG. 11. In FIG. 11, the measurement instrument 140 transmits instantaneous measurements of wafer voltage, ion density and etch rate to the contour generator 1120. The contour generator 1120 also receives the current source power and bias power commands, as indicated in FIG. 11, allowing it to correlate behavior of the performance parameters of wafer voltage, ion density and etch rate, with the control parameters of source power and bias power.

FIG. 18 illustrates the operation of the contour generator 1120 in finding functions defining how certain performance parameters vary with source power. As in FIG. 17, in FIG. 18 these include functions for the performance parameters of wafer voltage, ion density and etch rate. Also as in FIG. 17, in the operation of FIG. 18 is carried out using the configuration of FIG. 11.

FIG. 19 illustrates the operation of the contour generator 1120 in parameterizing the separate functions of source power and bias power discovered in the operations of FIGS. 17 and 18 into combined functions of both source power and bias power. Such combined functions represent the behavior of the performance parameters (wafer voltage, ion density, etch rate) in 2-dimensional $P_{source}$–$P_{bias}$ space. The contour generator 1120 then derives the contours of constant ion density, ion energy and etch rate from the respective combined functions.

The operation depicted in FIG. 17 will now be described in detail with reference to both FIGS. 11 and 17. In the step of block 1710 of FIG. 17, the frequencies of the bias and source power generators 125, 920 of FIG. 11 are set to constant values, the exhaust rate of a vacuum pump 1180 of the reactor of FIG. 11 is controlled to achieve a constant chamber pressure, and mass flow rates from gas supplies 1182, 1184 are set through a mass flow controller 1186 of FIG. 11 to constant values. In the step of block 1720 of FIG. 17, the power level of the source power generator 920 of FIG. 11 is set to an initial set point, so that the entire process is at a steady state with the exception of the bias power level. In the step of block 1730 of FIG. 17, the power level of the bias power generator 125 of FIG. 11 is set at the beginning of a predetermined range. The measurement instrument 140 then senses the voltage current and power at the impedance match 130 in order to measure wafer voltage, ion density and etch rate in the manner described previously with respect to FIGS. 1-8 (block 1740 of FIG. 17). These measurements are sent to the contour generator 1120 and stored in a memory 1120a. In the next step (block 1750 of FIG. 17), the power level of the bias power generator 125 of FIG. 11 is incremented (by command of the controller 1110) to a slightly higher value and held at that value. A determination is then made in the step of block 1760 of FIG. 17 as to whether or not the latest bias power level is at the end of the bias power range. If not (ANO@ branch of block 1760), the operation returns in a loop 1765 to the step of block 1740. The steps within the loop 1765 are repeated in this manner until the end of the bias power range is reached (AYES@ branch of block 1760). The result is that three sets of data corresponding to functions of bias power defining the behaviors of wafer voltage, ion density and etch rate are stored in the memory 1120a. Using conventional data fit algorithms, the contour generator uses the three sets of data to produce algebraic functions corresponding to the data, which are stored in the memory 1120a as follows:

$$V_{wafer} = f_a(P_{bias})_i$$
$$\eta = f_b(P_{bias})_i$$
$$ER = f_c(P_{bias})_i$$

where η is plasma ion density, ER is etch rate and the index i refers to the current level of the source power generator 915 (block 1770). In the next step of FIG. 17 (block 1780), the level of the source power generator 915 is incremented to a new value so that i6i+1. If the new source power level is not at the end of the source power range (ANO@ branch of block 1790), then the operation returns in a loop 1795 to the step of block 1730, and the steps within the loop 1795 (i.e., blocks 1730 through 1790) are repeated until the source power level reaches the end of the source power range (AYES@ branch of block 1790). The result is that many sets of the functions $$V_{wafer} = f_a(P_{bias})_i$$
$$\eta = f_b(P_{bias})_i$$
$$ER = f_c(P_{bias})_i$$

for all values of i within the source power range are stored in the memory 1120a. This permits an analytical determination of whether or not the behavior of the three behavior parameters $V_{wafer}$, η, ER with bias power changes with source power. I have discovered that it does not change to a great extent, so that bias power and source power are at least nearly independent variables. Thus, a single function of bias power for each of the parameters $V_{wafer}$, η, ER generally suffices as a fairly accurate prediction of behavior over the entire range of the source power level, at least for the range chosen in the working examples given later in this specification. Thus, the loop 1795 of FIG. 17 may not be strictly necessary. Instead, it may be acceptable to choose a single value for the source power level in the middle of the source power level range in step 1720 and perform the loop of 1765 to produce a single set of data for each of the three functions $$V_{wafer} = f_a(P_{bias})$$
$$\eta = f_b(P_{bias})$$
$$ER = f_c(P_{bias})$$

These three functions of bias power are stored in the memory 1120a.

The operation depicted in FIG. 18 will now be described in detail with reference to both FIGS. 11 and 18. In the step of block 1810 of FIG. 18, the frequencies of the bias and source power generators 125, 920 of FIG. 11 are set to constant values, the exhaust rate of a vacuum pump 1180 of the reactor of FIG. 11 is controlled to achieve a constant chamber pressure, and mass flow rates from gas supplies 1182, 1184 are set through a mass flow controller 1186 of FIG. 11 to constant values. In the step of block 1820 of FIG. 18, the power level of the bias power generator 125 of FIG. 11 is set to an initial set point, so that the entire process is at a steady state with the exception of the source power level. In the step of block 1830 of FIG. 18, the power level of the source power generator 920 of FIG. 11 is set at the beginning of a predetermined range. The measurement instrument 140 then senses the voltage current and power at the impedance match 130 in order to measure wafer voltage, ion density and etch rate in the manner described previously with respect to FIGS. 1-8 (block 1840 of FIG. 18). These measurements are sent to the contour generator 1120 and stored in the memory 1120a. In the next step (block 1850 of FIG. 18), the power level of the source power generator 920 of FIG. 11 is incremented (by command of the controller 1110) to a slightly higher value and held at that value. A determination is then made in the step of block 1860 of FIG. 18 as to whether or not the latest source power level is at the end of the source power range. If not (NO branch of block 1860), the operation returns in a loop 1865 to the step of block 1840. The steps within the loop 1865 are repeated in this manner until the end of the source power range is reached (YES branch of block 1860). The result is that three sets of data corresponding to functions of source power defining the behaviors of wafer voltage, ion density and etch rate are stored in the memory 1120a. Using conventional data fit algorithms, the contour generator 1120 uses the three sets of data to produce algebraic functions corresponding to the data, which are stored in the memory 1120a as follows:

$$V_{wafer} = f_a(P_{source})_i$$
$$= f_b(P_{source})_i$$
$$ER = f_c(P_{source})_i$$

where η is plasma ion density, ER is etch rate and the index i refers to the current level of the bias power generator 125 (block 1870). In the next step of FIG. 18 (block 1880), the level of the bias power generator 125 is incremented to a new value so that i6i+1. If the new bias power level is not at the end of the bias power range (NO branch of block 1890), then the operation returns in a loop 1895 to the step of block 1830, and the steps within the loop 1895 (i.e., blocks 1830 through 1890) are repeated until the bias power level reaches the end of the bias power range (YES branch of block 1890). The result is that many sets of the functions $$V_{wafer} = f_a(P_{source})_i$$
$$= f_b(P_{source})_i$$
$$ER = f_c(P_{source})_i$$

for all values of i within the bias power range are stored in the memory 1120a. This permits an analytical determination of whether or not the behavior of the three behavior parameters $V_{wafer}$, η, ER with source changes with bias power. I have discovered (as in the case of FIG. 17) that it does not change to a great extent, so that bias power and source power are at least nearly independent variables, as discussed above. Thus, a single function of source power for each of the parameters $V_{wafer}$, η, ER generally suffices as a fairly accurate prediction of behavior over the entire range of the bias power level, at least for the range chosen in the working examples given later in this specification. Thus, the loop 1895 of FIG. 18 may not be strictly necessary. Instead, it may be acceptable to choose a single value for the bias power level in the middle of the bias power level range in step 1820 and perform the loop of 1865 to produce a single set of data for each of the three functions $$V_{wafer} = f_a(P_{source})$$
$$= f_b(P_{source})$$
$$ER = f_c(P_{source})$$

These three functions of source power are stored in the memory 1120a. Thus, upon completion of the operations of FIGS. 17 and 18, the memory 1120a holds the following pair of functions for the wafer voltage:

$$V_{wafer} = f_a(P_{source})$$

$$V_{wafer} = f_a(P_{bias})$$

and following pair of functions for the ion density:

$$= f_b(P_{source})$$

$$= f_b(P_{bias})$$

and the following pair of functions for etch rate:

$$ER = f_c(P_{source})$$

$$ER = f_c(P_{bias}).$$

In the operation illustrated in FIG. 19, the contour generator 1120 combines each pair of functions having a single variable $P_{source}$, or $P_{bias}$, respectively, into a single combined function of the variable pair $P_{source}$ and $P_{bias}$. This produces the following three functions:

$$V_{wafer}(P_{source}, P_{bias})$$

$$\eta(P_{source}, P_{bias})$$

$$ER(P_{source}, P_{bias})$$

Contours of constant parameter values (e.g., a contour of constant wafer voltage, a contour of constant etch rate, a contour of constant ion density) are found by setting the respective function to a constant value and then solving for $P_{source}$ as a function of $P_{bias}$. For example, in order to generate a contour of constant wafer voltage at 300 V, the function $V_{wafer}(P_{source}, P_{bias})$ is set equal to 300 V, and then solved for $P_{source}$.

Operation of the contour generator 1120 of FIG. 11 in carrying out the foregoing steps of generating the combined two-variable functions and then solving them for $P_{source}$ as a function of $P_{bias}$ at various constant values is illustrated in FIG. 19. Referring now to FIG. 19, the first step (block 1910) is to take the single variable functions of wafer voltage, i.e., $V_{wafer}(P_{source})$ and $V_{wafer}(P_{bias})$ and find their combined function. The next step (block 1920) is to take the single variable functions of ion density, i.e., η ($P_{source}$) and η ($P_{bias}$) and find their combined function η ($P_{source}$, $P_{bias}$). The third step (block 1930) is to take the single variable functions of etch rate, i.e., ER ($P_{source}$) and ER ($P_{bias}$) and find their combined function ER ($P_{source}$, $P_{bias}$).

Then, the contours of constant values are generated. To generate a contour of constant wafer voltage (block 1940 of FIG. 19), the function $V_{wafer}$ ($P_{source}$,$P_{bias}$) is set equal to a constant value of wafer voltage and the resulting expression is then solved for $P_{source}$ as a function of $P_{bias}$. This step is repeated for a range of constant wafer voltage values to generate a set of contours covering the range. These contours are stored in the memory 1120a of FIG. 11 (block 1945 of FIG. 19).

To generate a contour of constant ion density (block 1950 of FIG. 19), the function η ($P_{source}$,$P_{bias}$) is set equal to a constant value of ion density and the resulting expression is solved for $P_{source}$ as a function of $P_{bias}$. This step is repeated for a range of constant ion density values to generate a set of contours covering the range of ion density values. These contours are stored in the memory 1120a of FIG. 11 (block 1955 of FIG. 19).

To generate a contour of constant etch rate (block 1960 of FIG. 19), the function ER ($P_{source}$,$P_{bias}$) is set equal to a constant value of etch rate and the resulting expression solved for $P_{source}$ as a function of $P_{bias}$. This step is repeated for a range of constant etch rate values to generate a set of contours covering the range of etch rate values. These contours are stored in the memory 1120a of FIG. 11 (block 1965 of FIG. 19).

Generally, each combined two-variable function, e.g., $V_{wafer}$ ($P_{source}$,$P_{bias}$)) can be approximated by the product of the pair of individual functions, e.g., $V_{wafer}$ ($P_{source}$) and $V_{wafer}$ ($P_{bias}$). For example, ignoring all control parameters except RF power level and ignoring constants of proportionality:

$$V_{wafer} = f_a(P_{source}) \cdot [P_{source}]^{1/2}$$

$$V_{wafer} = f_a(P_{bias}) \cdot [P_{bias}]^{1/2}$$

so that the combined two-variable function is approximately:

$$V_{wafer} = F_a(P_{source}, P_{bias}) = f_a(P_{source}) f_a(P_{bias}) \cdot [P_{source}]^{1/2}[P_{bias}]^{1/2}$$

This expression, however is not exact. The exact function is best found by curve-fitting techniques involving all control parameters, namely $P_{source}$ and $P_{bias}$, as above, and in addition, source power frequency, bias power frequency, chamber pressure, and magnetic field (if any). I have found the following expression for $V_{wafer}$ as a function of both $P_{source}$ and $P_{bias}$:

$$V_{wafer}(P_{source}, P_{bias}) = V_0 (P_{bias}/P_{b0})^{0.4}[(P_{source}/P_{s0})$$
$$K_1(p/p_0)^{-1} + (p/p_0)^{0.5}]^{-0.5}$$

where $P_{b0}$ is a maximum bias power value, $P_{s0}$ is a maximum source power value, $p_0$ is a minimum chamber pressure, and p is the actual chamber pressure. In the reactor chamber described above, the maximum source power $P_{s0}$ was 1500 Watts, the maximum bias power $P_{b0}$ was 4500 Watts and the minimum pressure $p_0$ was 30 mT. These values may differ from the foregoing example depending upon chamber design and process design. $V_0$ is determined in accordance with the following procedure: the maximum bias power $P_{b0}$ is applied to the wafer pedestal while the source power is held to zero and the chamber is held to the minimum pressure $p_0$. The wafer voltage $V_{wafer}$ is then measured and this measured value is stored as $V_0$. $K_1$ is then determined by increasing the source power to its maximum value $P_{s0}$ and then measuring the wafer voltage $V_{wafer}$ again, and $K_1$ is adjusted until the foregoing equation yields the correct value for $V_{wafer}$.

The exponents in the foregoing equations were obtained by an extensive trial and error parameterization process for the reactor described in this specification. These exponents may be useful for other reactor designs, or the user may wish to try other exponents, depending upon the particular reactor design.

Ion density, η, and etch rate, ER, are both functions of $V_{wafer}$ and b, the plasma susceptance or imaginary part of the plasma admittance, as described previously herein with reference to FIG. 8:

$$\eta = b^2 V_{wafer}^2$$

and $$ER = kb^2 V_{wafer}^{3/2}$$

Therefore, only the plasma susceptance b need be specified in addition to $V_{wafer}$ to define ER and η, for the sake of brevity. I have found the following expression for the plasma susceptance b as a function of both $P_{source}$ and $P_{bias}$:

$$b(P_{source}, P_{bias}) = b_0(P_{bias}/P_{b0})^{-0.25}[(P_{source}/P_{s0})$$
$$(p/p_0)^{-0.65}] [K_2(P_{bias}/P_{b0})^{-0.62}(p/p_0)^3 + (p/p_0)^{0.27}]$$

where the definitions above apply and in addition $b_0$ is a reference susceptance value. The reference susceptance value $b_0$ is determined in accordance with the following procedure: the maximum bias power $P_{b0}$ is applied to the wafer pedestal while the source power is held to zero and the chamber is held to the minimum pressure $p_0$. The susceptance b is then measured at the wafer support pedestal (using a V/I meter, for example) and this measured value is stored as $b_0$. $K_2$ is then determined by increasing the source power to its maximum value $P_{s0}$ and then measuring the susceptance b again, and $K_2$ is adjusted until the foregoing equation yields the correct value for b.

Ion density, η, and etch rate, ER, are then obtained by substituting the expressions for $V_{wafer}$ and b into the foregoing expressions for η and ER.

Figure 20:
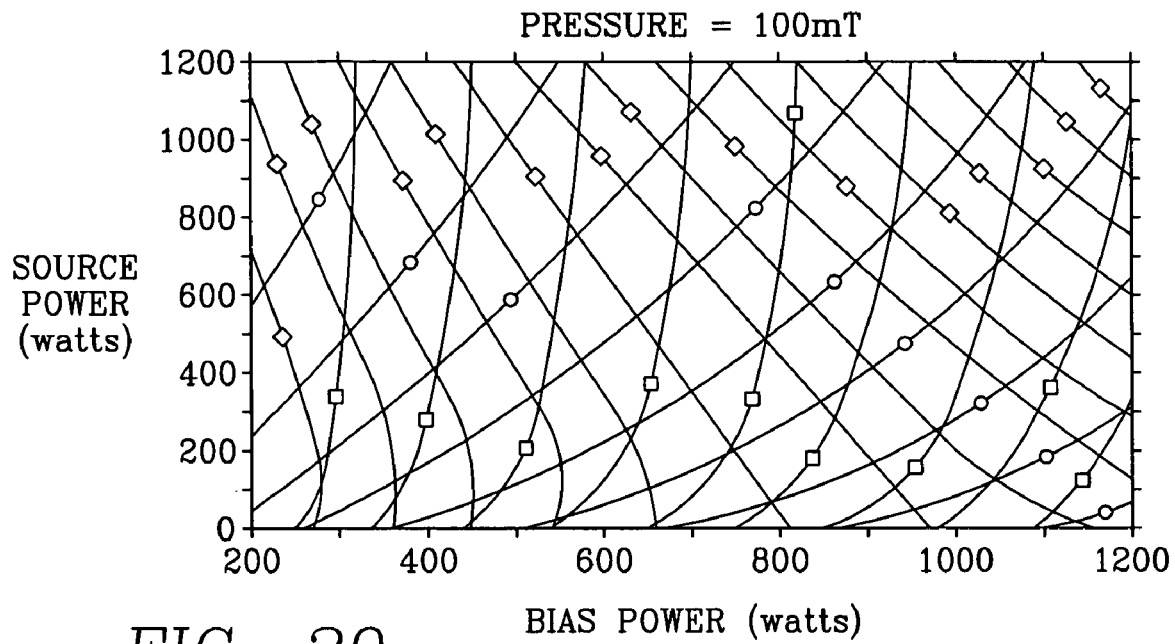
FIG. 20 illustrates an overlay of contours of constant wafer voltage, contours of constant etch rate and contours of constant ion density at a chamber pressure of 100 mT.
Figure 21:
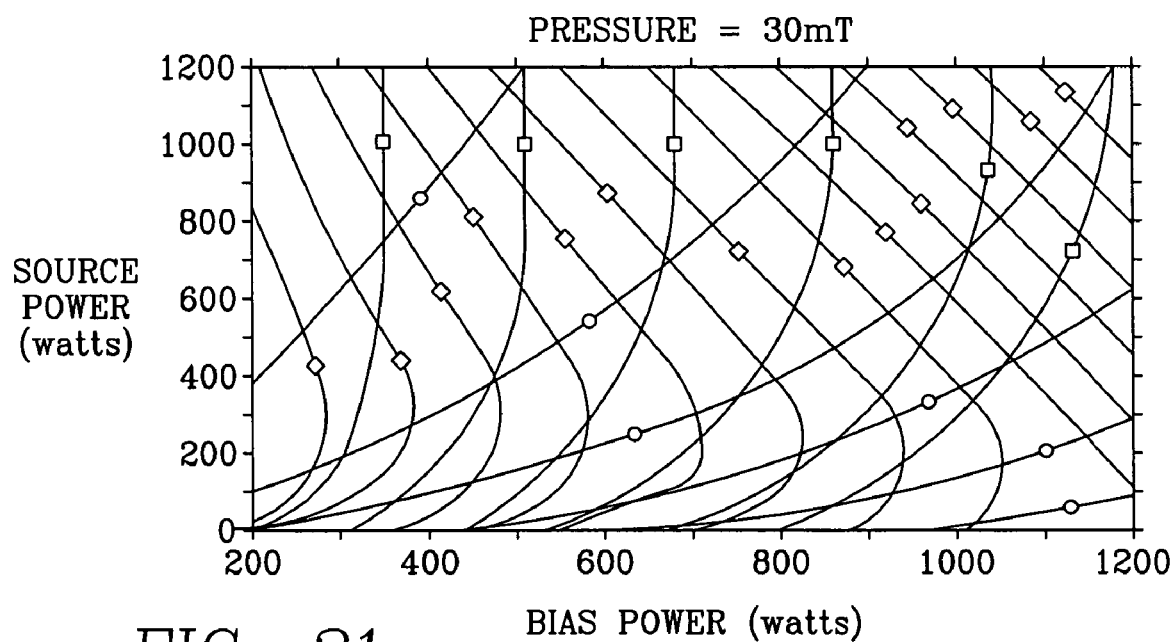
FIG. 21 illustrates an overlay of contours of constant wafer voltage, contours of constant etch rate and contours of constant ion density at a chamber pressure of 30 mT.
Figure 22:
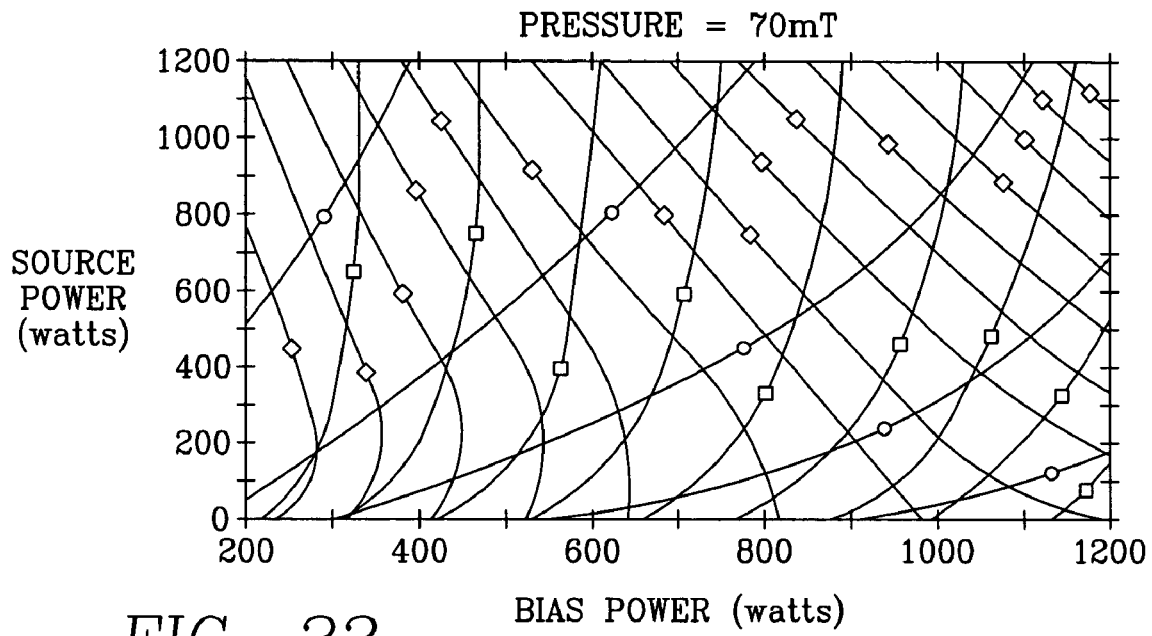
FIG. 22 illustrates an overlay of contours of constant wafer voltage, contours of constant etch rate and contours of constant ion density at a chamber pressure of 70 mT.
Figure 23:
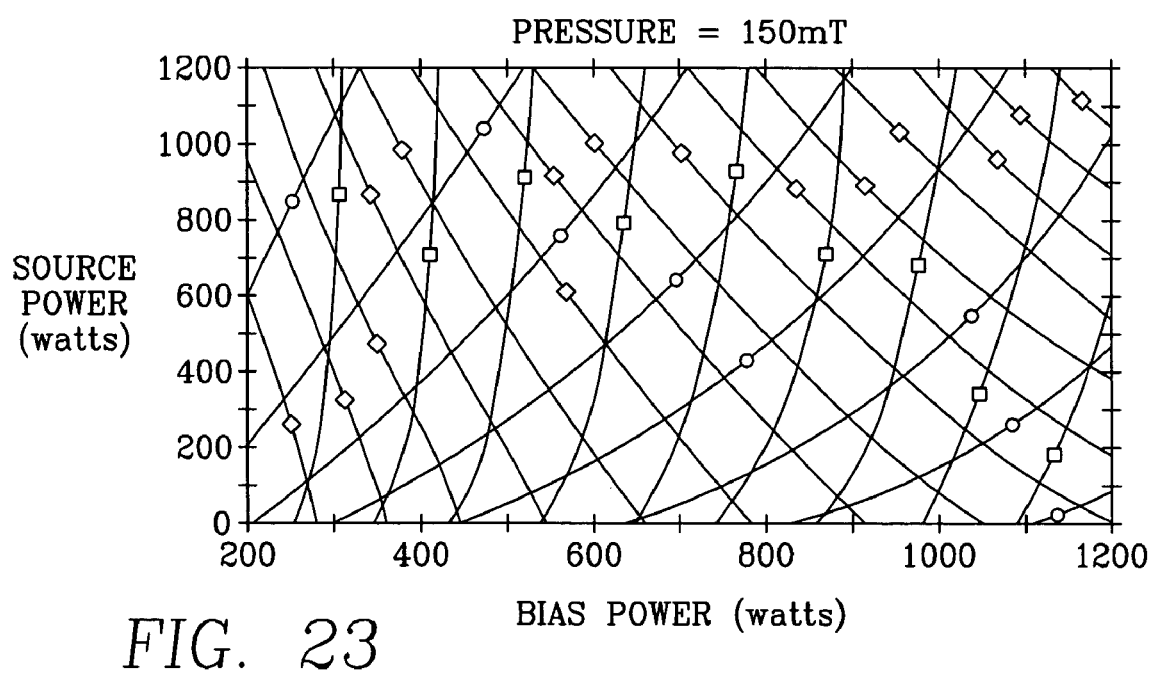
FIG. 23 illustrates an overlay of contours of constant wafer voltage, contours of constant etch rate and contours of constant ion density at a chamber pressure of 150 mT.
Figure 24:
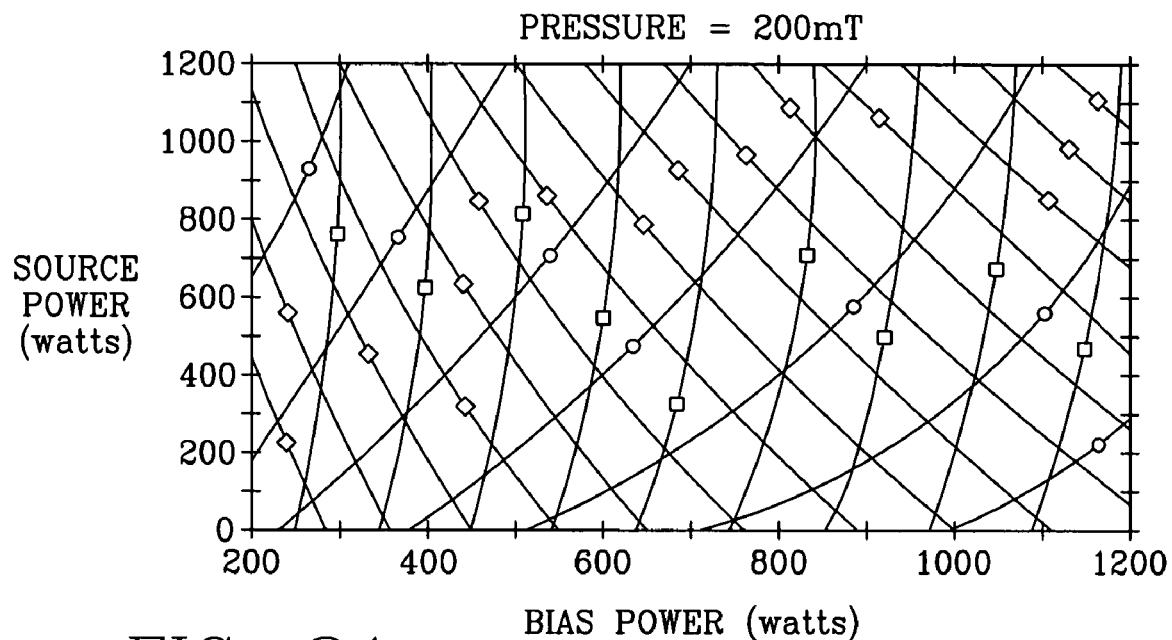
FIG. 24 illustrates an overlay of contours of constant wafer voltage, contours of constant etch rate and contours of constant ion density at a chamber pressure of 200 mT.
Figure 25:
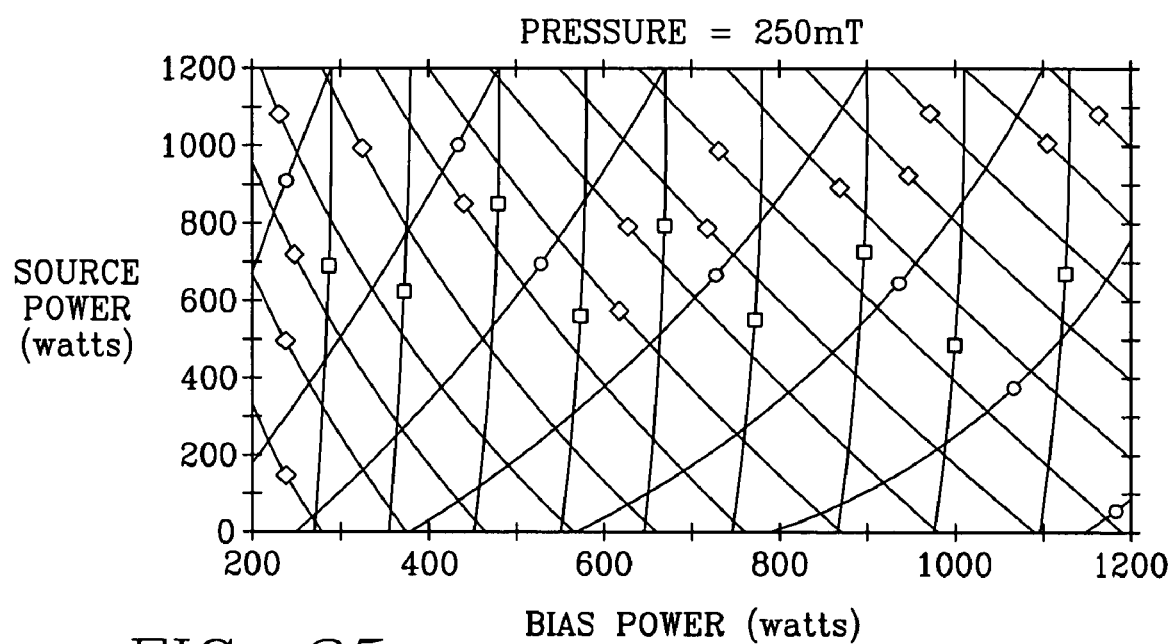
FIG. 25 illustrates an overlay of contours of constant wafer voltage, contours of constant etch rate and contours of constant ion density at a chamber pressure of 250 mT.

The results of the contour generator operation of FIG. 19 are illustrated for various chamber pressures in FIGS. 20-26. FIG. 20 illustrates contours of constant wafer voltage, contours of constant ion density and contours of constant etch rate superimposed upon one another in $P_{source}$-$P_{bias}$ space. The chamber pressure for these contours was 100 mT. The contours of constant wafer voltage are depicted in solid lines. The contours of constant ion density are depicted in dashed lines. The contours of constant etch rate are depicted in dotted lines. The source power range (the vertical axis or ordinate) has a range from zero to 1200 Watts. The bias power range (the horizontal axis or abscissa) has a range from 200 Watts to 1200 Watts. The stated values of constant wafer voltage are RMS volts. The stated values of constant ion density are $10^{10}$ ions/cm$^3$.

FIGS. 20, 21, 22, 23, 24 and 25 correspond to FIG. 20 for respective chamber pressures of 100 mT, 30 mT, 70 mT, 150 mT, 200 mT and 250 mT, respectively.

Once a complete set of contours of constant voltage, constant etch rate and constant ion density have been generated and permanently stored in the memory 120a, the contour generator and even the measurement instrument may be discarded. In such an implementation, the process set point controller 1110 would control the entire process based upon the contours stored in the memory 120a in response to user inputs. In this case, the process set point controller 1110 could apply the bias and source power level commands directly to the bias and source power generators 125, 920, respectively, so that the feedback controller 950 could also be eliminated in such an embodiment.

While the measurement instrument 140 has been described with reference to discrete processors 310, 320, 340, 350, 360 that carry out individual computations, these processors comprising the measurement instrument 140 can be implemented together in a programmed computer, such as a workstation or a personal computer rather than as separate hardware entities. The contour generator 1120 may also be implemented in a programmed computer or workstation. In addition, the feedback controller 950 of FIG. 9 or FIG. 10 may be implemented in a programmed computer. Moreover, the process set point controller may be implemented in a programmed computer.

The measurement instrument 140 has been described in certain applications, such as in a process control system. It is also useful as a tool for "fingerprinting" or characterizing a particular plasma reactor by observing the etch rate, ion density and wafer voltage measured by the instrument 140 at a selected process setting of source power, bias power, pressure and other parameters.

While the description of FIG. 8 concerned an implementation in which etch rate is computed as $ER = b^2 V_{wafer}^2$ and ion density as $\eta = kb^2 V_{wafer}^{3/2}$, other functions may be employed, such as, for example, $[bV_{wafer}]^1$, or $[bV_{wafer}]^2$, or $gV_{wafer}^{3/2}$ (where g in this last expression is the conductance defined previously in this specification).

While the invention has been described in detail with reference to preferred embodiments, it is understood that variations and modifications thereof may be made without departing from the true spirit and scope of the invention.

What is claimed is:

1. A method of operating a plasma reactor chamber with respect to two plasma parameters selected from the group consisting of ion density, wafer voltage, etch rate and wafer current, by controlling chamber parameters of source power and bias power, said method comprising:

characterizing the reactor chamber by performing the steps of:

a. for each one of said chamber parameters, ramping the level of the one chamber parameter while sampling RF electrical parameters at an RF bias power input to a wafer support pedestal and computing from each sample of said RF electrical parameters the values of said plasma parameters, and storing said values with the corresponding levels of said one chamber parameter as corresponding chamber parameter data;

b. for each one of said chamber parameters, deducing, from the corresponding chamber parameter data, a single variable function for each of said plasma parameters having said one chamber parameter as an independent variable;

c. constructing combinations of said functions and from said combinations, constructing surfaces defining concurrent values of said chamber parameters, each respective surface corresponding to a respective constant value of one of said plasma parameters, and storing said surfaces;

controlling a plasma in the chamber during processing of a production wafer in the chamber in accordance with user-selected values of each of said plasma parameters by performing the following steps:

a. for each one of said plasma parameters, fetching a relevant surface of constant value corresponding to the user-selected value of said one plasma parameter, and determining an intersection of the relevant surfaces which defines a target value of source power and bias power; and b. setting said source power and bias power in said chamber, respectively, to the target value.

2. The method of claim 1 wherein the step of sampling RF electrical parameters at an RF bias power input to said wafer support pedestal comprises:

sensing an input impedance, an input current and an input voltage to a transmission line coupled between a bias power impedance match circuit and an electrode within the wafer pedestal.

3. The method of claim 2 wherein the step of computing from each sample of said RF electrical parameters the values of plural plasma parameters is carried out separately for plasma parameters of ion density, wafer voltage and etch rate.

4. The method of claim 3 wherein the step of computing from each sample of said RF electrical parameters the values of plural plasma parameters comprises:

computing a junction admittance of a junction between said transmission line and the electrode within the wafer pedestal from said input impedance, input current and input voltage and from parameters of the transmission line.

5. The method of claim 4 wherein the step of computing from each sample of said RF electrical parameters the values of plural plasma parameters further comprises:

providing shunt electrical quantities of a shunt capacitance between the electrode and a ground plane;

providing load electrical quantities of a load capacitance between the electrode and a wafer on the pedestal.

6. The method of claim 5 wherein the step of computing from each sample of said RF electrical parameters the values of plural plasma parameters further comprises:

computing said etch rate, plasma ion density and wafer voltage from said junction admittance, said shunt electrical quantities, said load electrical quantities and a frequency of RF bias power applied to said electrode.

7. The method of claim 6 wherein said parameters of said transmission line comprise a length of said transmission line, a characteristic impedance of said transmission line and a complex loss factor of said transmission line.

8. The method of claim 7 wherein said shunt electrical quantities are computed from the size of an electrode-to-ground gap length, an area of said wafer, an electrode-to-ground dielectric constant and an electrode-to-ground conductive loss component.

9. The method of claim 8 wherein said load electrical quantities are computed from an electrode-to-wafer gap length, an area of the wafer, an electrode-to-wafer dielectric constant and an electrode-to-wafer conductive loss component.

10. The method of claim 1 wherein the combination of functions for wafer voltage $V_{wafer}$ at a given chamber pressure p is:

$$V_{wafer}(P_{source}, P_{bias}) = V_0 (P_{bias}/P_{b0})^a [(P_{source}/P_{s0}) K_1 (p/p_0)^{-1} + (p/p_0)^b]^c$$

where $V_0$ is a reference voltage, $P_{b0}$ is a maximum bias power, $P_{s0}$ is a maximum source power, $p_0$ is a minimum chamber pressure and $K_1$ is a constant and a, b and c are real numbers.

11. The method of claim 10 further comprising:
determining $V_0$ by applying zero plasma source power and maximum plasma bias power and setting chamber pressure at the minimum $p=p_0$ and measuring the wafer voltage; and
determining $K_1$ by increasing the source power to the maximum value while measuring wafer voltage and adjusting $K_1$ until the expression yields the measured value for wafer voltage.

12. The method of claim 11 wherein other plasma parameters of ion density or etch rate are combinations of functions of wafer voltage and plasma susceptance, and an expression for plasma susceptance is:

$$S(P_{source}, P_{bias}) = S_0 (P_{bias}/P_{b0})^e [(P_{source}/P_{s0})(p/p_0)^f] [K_2(P_{bias}/P_{b0})^g (p/p_0)^h + (p/p_0)^i]$$

where $S_0$ is a reference susceptance and $K_2$ is a constant and e, f, g, h and i are real numbers.

13. The method of claim 12 further comprising:
determining $b_0$ by applying maximum bias power and zero source power while holding the chamber at minimum pressure and measuring susceptance;
determining $K_2$ by increasing source power to the maximum value, measuring susceptance and changing $K_2$ until the expression yields the measured value of susceptance.

14. The method of claim 13 wherein the function for plasma ion density $\eta$ is a combination of the susceptance and wafer voltage as follows:

$$\eta = S^2 V_{wafer}^2.$$

15. The method of claim 14 wherein the expression for etch rate ER is a function of the expressions for susceptance and wafer voltage as follows:

$$ER = kS^2 V_{wafer}^{3/2}.$$

16. A method of operating a plasma reactor chamber with respect to two plasma parameters selected from the group consisting of ion density, wafer voltage, etch rate and wafer current, by controlling chamber parameters of source power and bias power, said method comprising:
characterizing the reactor chamber by performing the steps of:
  a. for each one of said chamber parameters, ramping the level of the one chamber parameter while sampling RF electrical parameters at an RF bias power input to said wafer support pedestal and computing from each sample of said RF electrical parameters the values of said plasma parameters, and storing said values with the corresponding levels of said one chamber parameter as corresponding chamber parameter data;
  b. for each one of said chamber parameters, deducing, from the corresponding chamber parameter data, a single variable function for each of said plasma parameters having said one chamber parameter as an independent variable;
  c. constructing combinations of said functions and from said combinations, constructing surfaces defining concurrent values of said chamber parameters, each respective surface corresponding to a respective constant value of one of said plasma parameters, and storing said surfaces;
wherein the step of constructing surfaces defining simultaneous values of said chamber parameters comprises the following step carried out for each one of said plasma parameters:
combining the single variable functions dependent upon respective single variables of source power and bias power into a single composite function dependent upon both source power and bias power.

17. The method of claim 16 wherein the step of constructing surfaces defining simultaneous values of said selected chamber parameters further comprises the following step carried out for each one of said selected plasma parameters:
setting the composite function equal to a succession of values of the respective plasma parameter.

18. The method of claim 17 wherein the step of constructing surfaces defining simultaneous values of said chamber parameters further comprises the following step carried out for each one of said selected plasma parameters:
for each one of said succession of values, solving for a surface defining a set of simultaneous values of source power and bias power for which the respective plasma parameter has the one value.

* * * * *